(12) United States Patent
Yamamoto et al.

(10) Patent No.: US 11,404,585 B2
(45) Date of Patent: Aug. 2, 2022

(54) SEMICONDUCTOR DEVICE AND METHOD FOR MANUFACTURING SEMICONDUCTOR DEVICE

(71) Applicant: Semiconductor Energy Laboratory Co., Ltd., Atsugi (JP)

(72) Inventors: Yoshitaka Yamamoto, Yamatokoriyama (JP); Tetsuhiro Tanaka, Isehara (JP); Toshihiko Takeuchi, Atsugi (JP); Yasumasa Yamane, Atsugi (JP); Takayuki Inoue, Sagamihara (JP); Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 21 days.

(21) Appl. No.: 15/946,149

(22) Filed: Apr. 5, 2018

(65) Prior Publication Data

US 2018/0233597 A1    Aug. 16, 2018

Related U.S. Application Data

(63) Continuation of application No. 14/313,154, filed on Jun. 24, 2014, now abandoned.

(30) Foreign Application Priority Data

Jul. 8, 2013  (JP) .............................. JP2013-142308

(51) Int. Cl.
*H01L 29/786* (2006.01)
*H01L 29/66* (2006.01)
(Continued)

(52) U.S. Cl.
CPC .... *H01L 29/7869* (2013.01); *H01L 29/40114* (2019.08); *H01L 29/42384* (2013.01);
(Continued)

(58) Field of Classification Search
CPC ......... H01L 29/78648; H01L 29/66833; H01L 29/792; H01L 29/7923; H01L 29/78696;
(Continued)

(56) References Cited

U.S. PATENT DOCUMENTS 5,079,606 A * 1/1992 Yamamura ......... G11C 16/0466
257/365
5,731,856 A    3/1998 Kim et al.
(Continued)

FOREIGN PATENT DOCUMENTS

EP    1737044 A    12/2006
EP    2226847 A    9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Lauren R Bell
(74) *Attorney, Agent, or Firm* — Robinson Intellectual Property Law Office; Eric J. Robinson

(57) ABSTRACT

A manufacturing method of a semiconductor device in which the threshold is adjusted to an appropriate value is provided. The semiconductor device includes a semiconductor, a source or drain electrode electrically connected to the semiconductor, a first gate electrode and a second gate electrode between which the semiconductor is sandwiched, an electron trap layer between the first gate electrode and the semiconductor, and a gate insulating layer between the second gate electrode and the semiconductor. By keeping a potential of the first gate electrode higher than a potential of the source or drain electrode for 1 second or more while (Continued)

heating, electrons are trapped in the electron trap layer. Consequently, threshold is increased and Icut is reduced.

20 Claims, 19 Drawing Sheets

(51) Int. Cl.
  *H01L 21/28* (2006.01)
  *H01L 29/423* (2006.01)
  *H01L 29/49* (2006.01)
  H01L 27/1156 (2017.01)
(52) U.S. Cl.
  CPC .... *H01L 29/4908* (2013.01); *H01L 29/66969* (2013.01); *H01L 29/78648* (2013.01); *H01L 29/78696* (2013.01); H01L 27/1156 (2013.01); H01L 29/40117 (2019.08); H01L 2029/42388 (2013.01)
(58) Field of Classification Search
  CPC . H01L 29/7869–78693; H01L 29/4234; H01L 29/42384; H01L 2029/42388; H01L 27/1225
  See application file for complete search history.

(56) References Cited

U.S. PATENT DOCUMENTS

| | | |
|---|---|---|
| 5,744,864 A | 4/1998 | Cillessen et al. |
| 5,751,037 A | 5/1998 | Aozasa et al. |
| 5,902,650 A | 5/1999 | Feng et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,605,422 B2 | 10/2009 | Saitoh et al. |
| 7,674,650 B2 | 3/2010 | Akimoto et al. |
| 7,692,223 B2 | 4/2010 | Isobe et al. |
| 7,732,819 B2 | 6/2010 | Akimoto et al. |
| 7,791,072 B2 | 9/2010 | Kumomi et al. |
| 8,203,143 B2 | 6/2012 | Imai |
| 8,237,166 B2 | 8/2012 | Kumomi et al. |
| 8,378,351 B2 | 2/2013 | Fukumoto et al. |
| 8,384,080 B2 | 2/2013 | Taniguchi et al. |
| 8,389,991 B2 | 3/2013 | Morosawa et al. |
| 8,492,757 B2 | 7/2013 | Sakata. et al. |
| 8,502,221 B2 | 8/2013 | Yamazaki |
| 8,547,771 B2 | 10/2013 | Koyama |
| 8,569,823 B2 | 10/2013 | Ino et al. |
| 8,686,425 B2 | 4/2014 | Yamazaki et al. |
| 8,692,252 B2 | 4/2014 | Takata et al. |
| 8,723,176 B2 | 5/2014 | Yamazaki |
| 8,748,881 B2 | 6/2014 | Yamazaki |
| 8,748,886 B2 | 6/2014 | Yamazaki et al. |
| 8,765,522 B2 | 7/2014 | Yamazaki |
| 8,779,420 B2 | 7/2014 | Yamazaki |
| 8,779,428 B2 | 7/2014 | Kim et al. |
| 8,779,432 B2 | 7/2014 | Yamazaki et al. |
| 8,829,586 B2 | 9/2014 | Endo et al. |
| 8,890,152 B2 | 11/2014 | Yamazaki et al. |
| 9,048,130 B2 | 6/2015 | Yamazaki et al. |
| 9,053,961 B2 | 6/2015 | Kaneko et al. |
| 9,076,874 B2 | 7/2015 | Yamazaki et al. |
| 9,166,060 B2 | 10/2015 | Yamazaki et al. |
| 9,287,409 B2 | 3/2016 | Yamazaki et al. |
| 9,362,318 B2 | 6/2016 | Kaneko et al. |
| 9,368,607 B2 | 6/2016 | Yamazaki et al. |
| 9,385,238 B2 | 7/2016 | Yamazaki |
| 9,548,397 B2 | 1/2017 | Yamazaki et al. |
| 9,601,636 B2 | 3/2017 | Yamazaki et al. |
| 9,711,656 B2 | 7/2017 | Yamazaki et al. |
| 9,768,307 B2 | 9/2017 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2003/0235076 A1 | 12/2003 | Forbes |
| 2004/0038446 A1 | 2/2004 | Takeda et al. |
| 2004/0069990 A1* | 4/2004 | Mahajani ............... H01L 29/513 257/66 |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2005/0205969 A1 | 9/2005 | Ono et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0249780 A1 | 11/2006 | Mori |
| 2006/0255399 A1 | 11/2006 | Kim et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0096396 A1 | 4/2008 | Shih et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park. et al. |
| 2008/0230831 A1 | 9/2008 | Noda et al. |
| 2008/0237687 A1 | 10/2008 | Kim et al. |
| 2008/0254569 A1 | 10/2008 | Hoffman et al. |

(56) References Cited

U.S. PATENT DOCUMENTS

| | | |
|---|---|---|
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0296650 A1 | 12/2008 | Ahn et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0059744 A1 | 3/2010 | Yin et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0304529 A1 | 12/2010 | Sasaki et al. |
| 2011/0101438 A1 | 5/2011 | Yoo et al. |
| 2011/0140100 A1 | 6/2011 | Takata et al. |
| 2011/0240987 A1 | 10/2011 | Lee et al. |
| 2011/0240991 A1 | 10/2011 | Yamazaki |
| 2011/0284848 A1 | 11/2011 | Yamazaki |
| 2011/0309876 A1 | 12/2011 | Terai et al. |
| 2012/0001173 A1 | 1/2012 | Suzuki et al. |
| 2012/0056175 A1 | 3/2012 | Takemura |
| 2012/0085998 A1 | 4/2012 | Kwon et al. |
| 2012/0112257 A1 | 5/2012 | Kato |
| 2012/0132903 A1 | 5/2012 | Yamazaki et al. |
| 2012/0146713 A1* | 6/2012 | Kim ................. H01L 29/41733 327/530 |
| 2012/0155150 A1 | 6/2012 | Nagatsuka et al. |
| 2012/0161139 A1 | 6/2012 | Endo et al. |
| 2012/0223305 A1 | 9/2012 | Sato et al. |
| 2012/0235118 A1 | 9/2012 | Avouris et al. |
| 2012/0248433 A1 | 10/2012 | Nakano et al. |
| 2012/0319102 A1* | 12/2012 | Yamazaki ........... H01L 29/7869 257/43 |
| 2012/0319183 A1 | 12/2012 | Yamazaki et al. |
| 2013/0009219 A1* | 1/2013 | Yamazaki ........... H01L 29/7869 257/288 |
| 2013/0009220 A1* | 1/2013 | Yamazaki ........... H01L 29/7869 257/288 |
| 2013/0320330 A1 | 12/2013 | Yamazaki |
| 2013/0320334 A1 | 12/2013 | Yamazaki et al. |
| 2013/0334533 A1 | 12/2013 | Yamazaki |
| 2014/0001465 A1 | 1/2014 | Yamazaki |
| 2014/0008647 A1 | 1/2014 | Yamazaki |
| 2014/0014947 A1 | 1/2014 | Yamazaki |
| 2014/0027762 A1 | 1/2014 | Tsurume et al. |
| 2014/0034945 A1 | 2/2014 | Tokunaga et al. |
| 2014/0042433 A1 | 2/2014 | Yamazaki |
| 2014/0042434 A1 | 2/2014 | Yamazaki |
| 2014/0042435 A1 | 2/2014 | Yamazaki |
| 2014/0042436 A1 | 2/2014 | Yamazaki |
| 2014/0042438 A1 | 2/2014 | Yamazaki |
| 2014/0054725 A1 | 2/2014 | Chang et al. |
| 2014/0097867 A1 | 4/2014 | Koyama |
| 2014/0346501 A1 | 11/2014 | Yamazaki |
| 2014/0349443 A1 | 11/2014 | Yamazaki |
| 2015/0011046 A1 | 1/2015 | Tanaka et al. |
| 2015/0091001 A1 | 4/2015 | Endo et al. |
| 2015/0287837 A1 | 10/2015 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 03-082164 A | 4/1991 |
| JP | 05-251705 A | 9/1993 |
| JP | 08-264794 A | 10/1996 |
| JP | 09-097851 A | 4/1997 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-268805 A | 9/2005 |
| JP | 2006-165528 A | 6/2006 |
| JP | 2008-060440 A | 3/2008 |
| JP | 2009-135350 A | 6/2009 |
| JP | 2010-067954 A | 3/2010 |
| JP | 2011-124360 A | 6/2011 |
| JP | 2011-138934 A | 7/2011 |
| JP | 2012-074692 A | 4/2012 |
| JP | 2012-169611 A | 9/2012 |
| JP | 2012-257187 A | 12/2012 |
| JP | 2013-021313 A | 1/2013 |
| JP | 2013-021315 A | 1/2013 |
| JP | 2013-038402 A | 2/2013 |
| JP | 2013-125826 A | 6/2013 |
| KR | 2012-0065048 A | 6/2012 |
| KR | 2013-0007426 A | 1/2013 |
| KR | 2014-0024866 A | 3/2014 |
| WO | WO-2004/114391 | 12/2004 |
| WO | WO-2010/106922 | 9/2010 |
| WO | WO-2012/102183 | 8/2012 |
| WO | WO-2012/172746 | 12/2012 |
| WO | WO-2013/008407 | 1/2013 |

OTHER PUBLICATIONS

Asaoka.Y et al., "29.1:Polarizer-Free Reflective LCD Combined With Ultra Low-Power Driving Technology", SID Digest '09: SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:AL and Sn-Doped Zinc Indium Oxide Thin Film Transistors for Amoled Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZNO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

(56) References Cited

OTHER PUBLICATIONS

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZNO TFTS) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission Amoled Display on Plastic Film and its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "SPINEL,YBFE2O4, and YB2FE3O7 Types of Structures for Compounds in the IN2O3 and SC2O3—A2O3—BO Systems [A; Fe, Ga, or Al; B: Mg, Mn, Fe, Nl, Cu,or Zn] at Temperatures Over 10000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., World's Largest (15-Inch) XGA AMLCD Panel Using IGZO Oxide TFT', SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors By DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 13500° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZNO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTS With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

(56) References Cited

OTHER PUBLICATIONS

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTS and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors By Ar Plasma Treatment", Appl. Phys. Lett. (Applied Physics Letters), Jun. 26, 2007, vol. 90, No. 26, pp. 262106-1-262106-3.

Park.S et al., "Challenge To Future Displays: Transparent AM-OLED Driven By Peald Grown Zno TFT", IMID '07 DIGEST, 2007, pp. 1249-1252.

Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-in. AMOLED Display With Driver Circuit Using Amorphous In—Ga—Zn-Oxide TFTS", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Lee.K et al., "The effect of moisture on the photon-enhanced negative bias thermal instability in Ga—In—Zn—O thin film transistors", Appl. Phys. Lett. (Applied Physics Letters) , Dec. 8, 2009, vol. 95, No. 23, pp. 232106-1-232106-3.

Han.D et al., "Impurity doping in SiO2: Formation energies and defect levels from first-principles calculations", Phys. Rev. B (Physical Review. B), Oct. 22, 2010, vol. 82, No. 15, pp. 155132-1-155132-7.

Ryu.B et al., "O-vacancy as the origin of negative bias illumination stress instability in amorphous In—Ga—Zn—O thin film transistors", Appl. Phys. Lett. (Applied Physics Letters) , 2010, vol. 97, No. 2, pp. 022108-1-022108-3.

Kang.J et al., "H-related defect complexes in HfO2 : A model for positive fixed charge defects", Appl. Phys. Lett. (Applied Physics Letters) , 2004, vol. 84, No. 19, pp. 3894-3896.

Bloechl.P et al., "Hydrogen Electrochemistry and Stress-Induced Leakage Current in Silica", Phys. Rev. Lett. (Physical Review Letters), Jul. 12, 1999, vol. 83, No. 2, pp. 372-375.

Kwon.J et al., "The impact of gate dielectric materials on the light-induced bias instability in Hf—In—Zn—O thin film transistor", Appl. Phys. Lett. (Applied Physics Letters) , 2010, vol. 97, No. 18, pp. 183503-1-183503-3.

Cheong.W et al., "Effects of Interfacial Dielectric Layers on the Electrical Performance of Top-Gate In—Ga—Zn-Oxide Thin-Film Transistors", ETRI Journal, Dec. 1, 2009, vol. 31, No. 6, pp. 660-666.

Jeong.J et al., "Origin of threshold voltage Instability in indium-gallium-zinc oxide thin film transistors", Appl. Phys. Lett. (Applied Physics Letters) , 2008, vol. 93, No. 12, pp. 123508-1-123508-3.

Jung.J et al., "The charge trapping characteristics of Si3N4 and Al2O3 layers on amorphous-indium-gallium-zinc oxide thin films for memory application", Appl. Phys. Lett. (Applied Physics Letters) , May 3, 2012, vol. 100, No. 18, pp. 183503-1-183503-4.

Sreenivasan.R et al., "Effect of impurities on the fixed charge of nanoscale HfO2 films grown by atomic layer deposition", Appl. Phys. Lett. (Applied Physics Letters) , 2006, vol. 89, No. 11, pp. 112903-1-112903-3.

Wang.W et al., "Effect of Al-diffusion-induced positive flatband voltage shift on the electrical characteristics of Al-incorporated high-k metal-oxide-semiconductor field-effective transistor", J. Appl. Phys. (Journal of Applied Physics) , 2009, vol. 105, No. 6, pp. 064108-1-064108-6.

Cho.Y et al., "Evaluation of Y2O3 gate Insulators for a-IGZO thin film transistors", Thin Solid Films, 2009, vol. 517, pp. 4115-4118, Elsevier.

Nomura.K et al., "Stability and high-frequency operation of amorphous In—Ga—Zn—O thin-film transistors with various passivation layers", Thin Solid Films, 2012, vol. 520, pp. 3778-3782, Elsevier.

Chong.E et al., "Localization effect of a current-path in amorphous In—Ga—Zn—O thin film transistors with a highly doped buried-layer", Thin Solid Films, 2011, vol. 519, pp. 4347-4350, Elsevier.

Copending U.S. Appl. No. 14/723,624.

Copending U.S. Appl. No. 14/476,767.

\* cited by examiner

108 Id-Vg characteristics before process

109 Id-Vg characteristics after process measurement of initial characteristics injection of electrons measurement resin sealing and packaging

SEMICONDUCTOR DEVICE AND METHOD FOR MANUFACTURING SEMICONDUCTOR DEVICE

BACKGROUND OF THE INVENTION

1. Field of the Invention

The present invention relates to a semiconductor device and a device including the semiconductor device.

In this specification, a "semiconductor device" refers to a device that can function by utilizing semiconductor characteristics; an electro-optical device, a semiconductor circuit, and an electronic device are all included in the category of the semiconductor device.

2. Description of the Related Art

A technique in which a transistor is formed using a semiconductor has attracted attention. The transistor is applied to a wide range of electronic devices such as an integrated circuit (IC) or an image display device (display device). A silicon-based semiconductor material is widely known as a material for a semiconductor applicable to a transistor. As another material, an oxide semiconductor has been attracting attention.

For example, a transistor including an amorphous oxide semiconductor layer containing indium (In), gallium (Ga), and zinc (Zn) is disclosed in Patent Document 1.

Techniques for improving carrier mobility by stacking oxide semiconductor layers are disclosed in Patent Documents 2 and 3.

It is known that a transistor including an oxide semiconductor layer has an extremely small leakage current when the transistor is off. For example, a low-power-consumption CPU utilizing the small leakage current characteristic of a transistor including an oxide semiconductor layer is disclosed (see Patent Document 4).

REFERENCE

Patent Document

[Patent Document 1] Japanese Published Patent Application No. 2006-165528
[Patent Document 2] Japanese Published Patent Application No. 2011-124360
[Patent Document 3] Japanese Published Patent Application No. 2011-138934
[Patent Document 4] Japanese Published Patent Application No. 2012-257187
[Patent Document 5] Japanese Published Patent Application No. 2012-074692

SUMMARY OF THE INVENTION

Miniaturization of transistors has been progressing with an increase in integration of circuits. The miniaturization of a transistor may cause deterioration of electrical characteristics, such as on-state current, off-state current, threshold, and an S value (subthreshold swing), of the transistor (see Patent Document 5). In general, decreasing the channel length increases the on-state current, but at the same time increases the off-state current, a variation in threshold, and the S value. When only the channel width is decreased, the on-state current is decreased.

An object of one embodiment of the present invention is to provide a semiconductor device in which the threshold voltage is adjusted to an appropriate value. An object is to provide a semiconductor device in which deterioration of electrical characteristics which becomes noticeable when the semiconductor device is miniaturized can be suppressed. Another object is to provide a highly integrated semiconductor device. Another object is to provide a semiconductor device in which deterioration of on-state current characteristics is reduced. Another object is to provide a semiconductor device with low power consumption. Another object is to provide a semiconductor device with high reliability. Another object is to provide a semiconductor device which can retain data even when power supply is stopped. Another object is to provide a semiconductor device with favorable characteristics.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a semiconductor device including a first semiconductor, an electrode which is electrically connected to the first semiconductor, a first gate electrode and a second gate electrode between which the first semiconductor is sandwiched, an electron trap layer between the first gate electrode and the first semiconductor, and a gate insulating layer between the second gate electrode and the first semiconductor.

Another embodiment of the present invention is a manufacturing method of the semiconductor device, in which electrons are trapped in the electron trap layer by performing heat treatment at higher than or equal to 125° C. and lower than or equal to 450° C. and at the same time, keeping the potential of the first gate electrode higher than the potential of the electrode for one second or longer.

In the above structure, a second semiconductor and a third semiconductor between which the first semiconductor is sandwiched may be further included. The second semiconductor may be placed between the first semiconductor and the first gate electrode. The third semiconductor may be placed between the first semiconductor and the gate insulating layer.

In the above structure, the first gate electrode preferably faces the top surface and the side surface of the first semiconductor.

In the above structure, the electron trap layer contains any one of hafnium oxide, aluminum oxide, tantalum oxide, and aluminum silicate.

With one embodiment of the present invention, a semiconductor device whose threshold is adjusted to an appropriate value can be provided. Furthermore, a semiconductor device can be provided in which lowering of electrical characteristics, which becomes noticeable when the semiconductor device is miniaturized, can be suppressed. A highly integrated semiconductor device can be provided. A semiconductor device with low power consumption can be provided. A highly reliable semiconductor device can be provided. A semiconductor device in which data is retained even when power supply is stopped can be provided.

BRIEF DESCRIPTION OF THE DRAWINGS

In the accompanying drawings.

DETAILED DESCRIPTION OF THE INVENTION

Figure 1A:
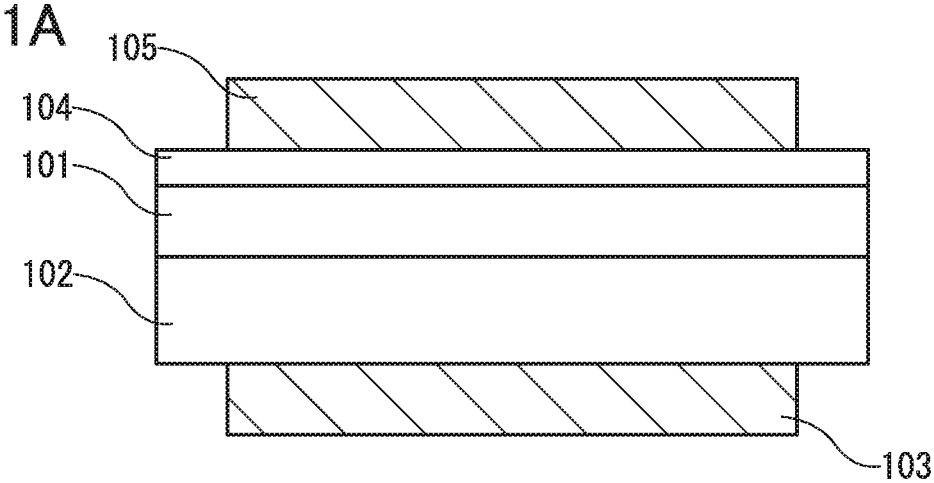
FIGS. 1A to 1C illustrate examples of a semiconductor device of an embodiment.

Embodiments will be described in detail with reference to drawings. Note that the present invention is not limited to the following description and it will be readily appreciated by those skilled in the art that modes and details can be modified in various ways without departing from the spirit and the scope of the present invention. Therefore, the present invention should not be interpreted as being limited to the description of Embodiments below.

Note that in structures of the present invention described below, the same portions or portions having similar functions are denoted by the same reference numerals in different drawings, and description thereof is not repeated in some cases.

Note that functions of a "source" and a "drain" of a transistor are sometimes replaced with each other when a transistor of opposite polarity is used or when the direction of current flowing is changed in circuit operation, for example. Therefore, the terms "source" and "drain" can be replaced with each other in this specification.

Note that in this specification and the like, ordinal numbers such as "first" and "second" are used in order to avoid confusion among components and do not limit the components numerically.

Embodiment 1

In this embodiment, a structure and operation principles of a semiconductor device including a semiconductor layer, an electron trap layer, and a gate electrode, and a circuit to which the semiconductor device is used will be described. FIG. 1A shows a semiconductor device including a semiconductor layer 101, an electron trap layer 102, a gate electrode 103, a gate insulating layer 104, and a gate electrode 105.

Figure 1B:
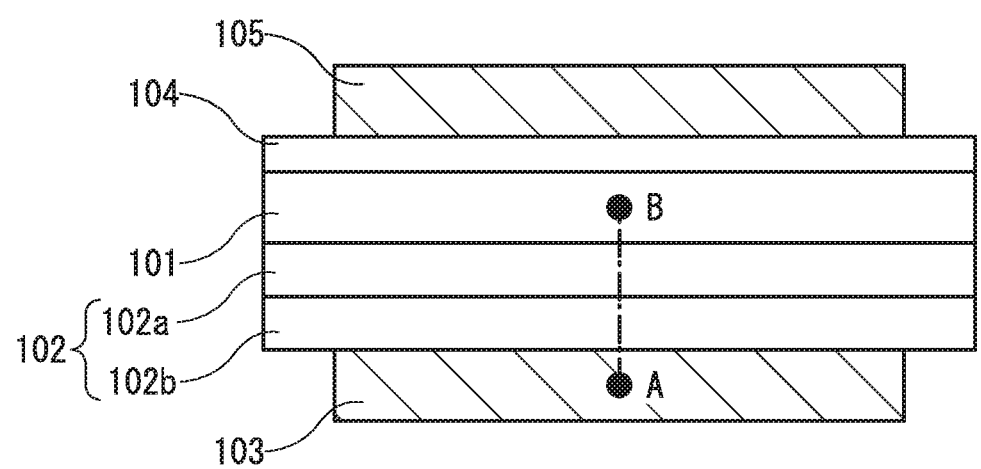
Figure 1C:
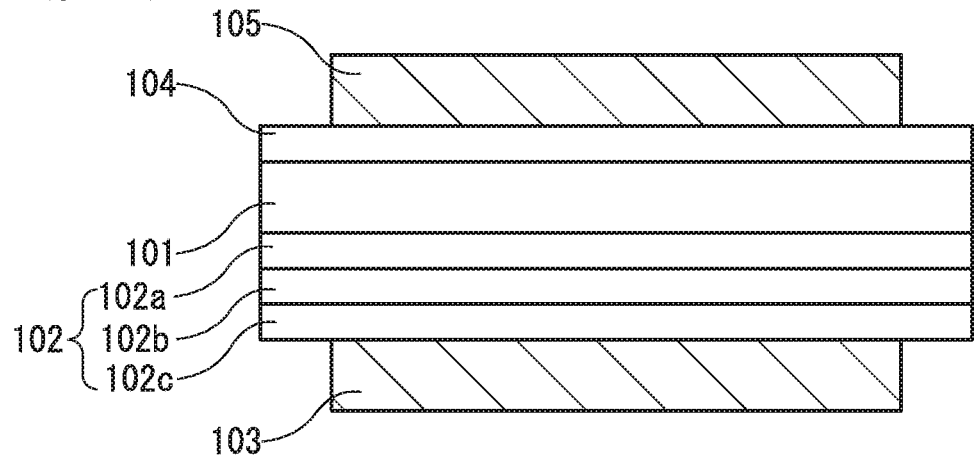
Figure 2:
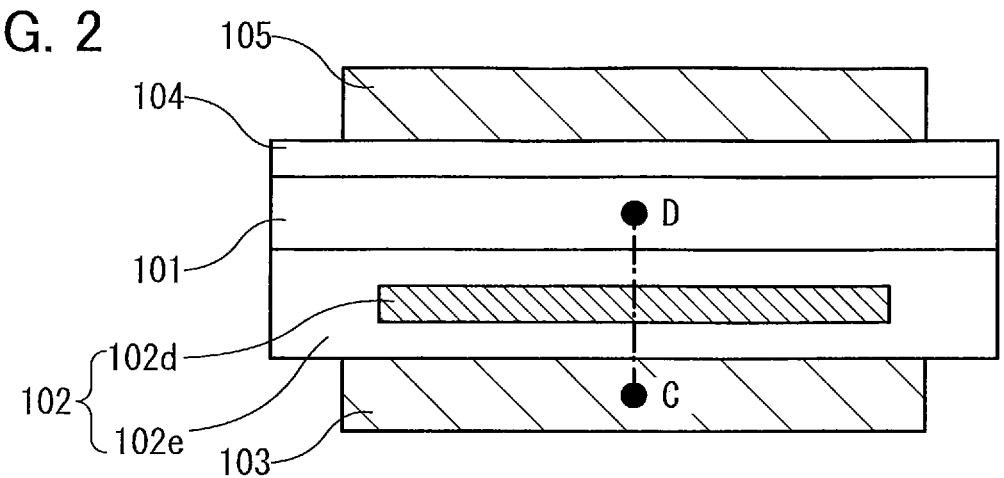
FIG. 2 illustrates an example of a semiconductor device of an embodiment.

As the electron trap layer 102, for example, a stacked body of a first insulating layer 102a and a second insulating layer 102b as shown in FIG. 1B, a stacked body of the first insulating layer 102a, the second insulating layer 102b, and a third insulating layer 102c as shown in FIG. 1C, or a stacked body of four or more layers may be used. As shown in FIG. 2, a conductive layer 102d which is electrically insulated may be included in an insulator 102e. The insulator 102e may be composed of a plurality of insulating layers.

Figure 3A:
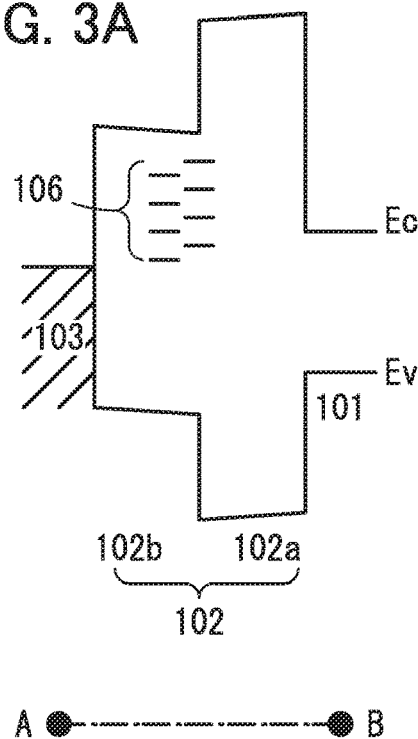
FIGS. 3A to 3D illustrate band diagram examples of a semiconductor device of an embodiment.

FIG. 3A is an example of a band diagram between points A and B in the semiconductor device illustrated in FIG. 1B. In FIGS. 3A to 3D, Ec and Ev denote the conduction band minimum and the valence band maximum, respectively. In FIG. 3A, the potential of the gate electrode 103 is equal to the potential of a source electrode or drain electrode (not illustrated).

In this example, the band gap of the first insulating layer 102a is larger than that of the second insulating layer 102b, and the electron affinity of the first insulating layer 102a is smaller than that of the second insulating layer 102b; however, the present invention is not limited to this example.

Figure 3B:
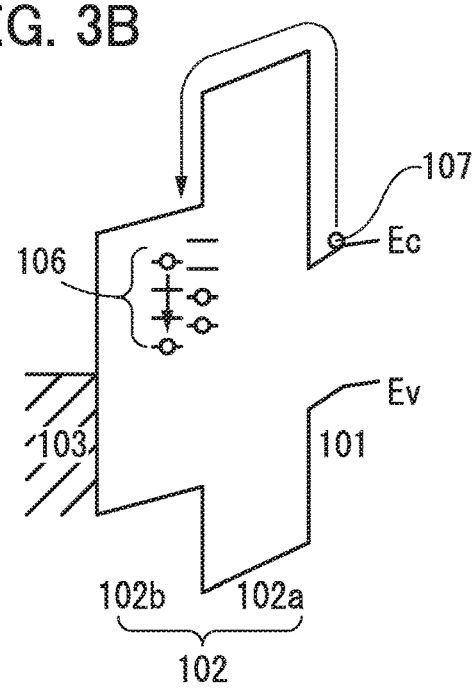

Electron trap states 106 exist at the interface between the first insulating layer 102a and the second insulating layer 102b or inside the second insulating layer 102b. FIG. 3B shows the state where the potential of the gate electrode 103 is higher than the potential of the source or drain electrode. The process for increasing the potential of the gate electrode 103 to a potential higher than the potential of the source or drain electrode under constant conditions is referred to as a threshold adjust process. The potential of the gate electrode 103 may be higher than the potential of the source or drain electrode by 1 V or more. After this process, the potential of the gate electrode 103 may be lower than the highest potential applied to the gate electrode 105. In the process, the difference between the potential of the gate electrode 103 and the potential of the source or drain electrode is typically less than 4 V.

Note that in this process, the potential of the gate electrode 105 is preferably equal to the potential of the source or drain electrode. In this process, electrons 107 that exist in the semiconductor layer 101 move toward the gate electrode 103 having a higher potential. Some of the electrons 107 moving from the semiconductor layer 101 toward the gate electrode 103 are trapped by the electron trap states 106.

There are some processes to enable the electrons 107 to go over the barrier of the first insulating layer 102a to reach the second insulating layer 102b. The first is a process by the tunnel effect. The thinner the first insulating layer 102a is, the more prominent the tunnel effect is. Note that electrons trapped by the electron trap states 106 may return to the semiconductor layer 101 by the tunnel effect.

Even when the first insulating layer 102a is relatively thick, the tunnel effect (Fowler-Nordheim tunnel effect) can be obtained by applying an appropriate voltage to the gate electrode 103. In the case of the Fowler-Nordheim tunnel effect, a tunnel current increases with the square of the electric field between the gate electrode 103 and the semiconductor layer 101.

The second is the process that the electrons 107 hop from trap states to trap states in the band gap such as defect states in the first insulating layer 102a to reach the second insulating layer 102b. This is a conduction mechanism called Poole-Frenkel conduction, in which as the absolute temperature is higher and trap states are shallower, the electric conductivity is higher.

The third is the process that the electrons 107 go over the barrier of the first insulating layer 102a by thermal excitation. The distribution of electrons existing in the semiconductor layer 101 follows the Fermi-Dirac distribution; in general, the proportion of electrons having high energy is larger as the temperature is higher. Assuming that the density of electrons having energy 3 eV higher than the Fermi level at 300 K (27° C.) is 1, for example, the density is $6 \times 10^{16}$ at 450 K (177° C.), $1.5 \times 10^{25}$ at 600 K (327° C.), and $1.6 \times 10^{30}$ at 750 K (477° C.).

The movement of the electrons 107 toward the gate electrode 103 by going over the barrier of the first insulating layer 102a occurs by the above three processes or the combination of these processes. In particular, the second and the third processes indicate that current increases exponentially as the temperature is higher.

Also, the Fowler-Nordheim tunnel effect is more likely to occur as the density of electrons in a thin part (a high-energy portion) of a barrier layer of the first insulating layer 102a is higher; thus, a higher temperature is better.

Note that in most cases, current generated by the conduction mechanism is weak in particular when the potential of the gate electrode 103 is low (5 V or lower). However, by taking a long time for the process, the needed number of electrons can be trapped by the electron trap states 106. As a result, the electron trap layer 102 is negatively charged.

In other words, the potential of the gate electrode 103 is kept higher than that of the source or drain electrode at a high temperature (a temperature higher than the operating temperature or the storage temperature of the semiconductor device, or higher than or equal to 125° C. and lower than or equal to 450° C., for example higher than or equal to 150° C. and lower than or equal to 300° C.) for one second or longer, for example, one minute or longer. As a result, the needed number of electrons moves from the semiconductor layer 101 toward the gate electrode 103 and some of them are trapped by the electron trap states 106. The temperature of the process for trapping electrons is referred to as process temperature below.

Here, the amount of electrons trapped by the electron trap states 106 can be controlled by the potential of the gate electrode 103. When an appropriate number of electrons is trapped by the electron trap states 106, due to the electric charge, the electric field of the gate electrode 103 is blocked and a channel formed in the semiconductor layer 101 disappears.

The total number of electrons trapped by the electron trap states 106 increases linearly at first, and then, the rate of increase gradually decreases and converges at a certain value. The convergence value depends on the potential of the gate electrode 103. As the potential is higher, the number of trapped electrons is more likely to be large; however, it never exceeds the total number of electron trap states 106.

The electrons trapped by the electron trap states 106 are required not to transfer from the electron trap layer 102 to the other regions. For this, each thickness of the first and second insulating layers 102a and 102b is preferably set at a thickness at which the tunnel effect is not a problem. For example, the physical thickness is preferably more than 1 nm.

However, electron transfer is hindered if the thickness of the first insulating layer 102a is too large; thus, 30 nm or less is preferable. Furthermore, if the thickness of the first and second insulating layers 102a and 102b is too large as compared with the channel length of the semiconductor device, the subthreshold value is increased to degrade the off-state characteristics. For this reason, the channel length is more than or equal to four times, typically more than or equal to ten times as large as the equivalent silicon oxide thickness of the first and second insulating layers 102a and 102b. Note that when a so-called High-K material is used, the equivalent silicon oxide thickness is less than the physical thickness.

The thickness of the first insulating layer 102a is preferably more than or equal to 10 nm and less than or equal to 20 nm, and the equivalent silicon oxide thickness of the second insulating layer 102b is more than or equal to 1 nm and less than or equal to 25 nm.

Another method is to set the operating temperature or the storage temperature of the semiconductor device at a temperature that is lower enough than the process temperature. For example, the probability that electrons go over a 3 eV-barrier when the temperature is 120° C. is less than a one hundred-thousandth that when the temperature is 300° C. In this way, although electrons that easily go over a barrier to be trapped by the electron trap states 106 during process at 300° C., the electrons are difficult to go over the barrier during storage 120° C. and are kept trapped by the electron trap states 106 for a long time.

It is also effective that the effective mass of a hole is extremely large or is substantially localized in the semiconductor layer 101. In this case, the injection of holes from the semiconductor layer 101 to the first and second insulating layers 102a and 102b does not occur and consequently a phenomenon in which electrons trapped by the electron trap states 106 bond to holes and disappear does not occur.

A material showing Poole-Frenkel conduction may be used for the second insulating layer 102b. The Poole-Frenkel conduction is, as described above, electron hopping conduction between defect states and the like in a material. A material including a large number of defect states or including deep defect states has low electric conductivity and consequently can hold electrons trapped by the electron trap states 106 for a long time.

Circuit design or material selection may be made so that no voltage at which electrons trapped in the first and second insulating layers 102a and 102b are released is applied. For example, in a material whose effective mass of holes is extremely large or is substantially localized, such as an In—Ga—Zn-based oxide semiconductor, a channel is formed when the potential of the gate electrode 103 is higher than that of the source or drain electrode; however, when the potential of the gate electrode 103 is lower than that of the source or drain electrode, the material shows characteristics similar to an insulator. In this case, the electric field between the gate electrode 103 and the semiconductor layer 101 is extremely small and consequently the Fowler-Nordheim tunnel effect or electron conduction according to the Poole-Frenkel conduction is significantly decreased.

To hold electrons trapped by electron trap states inside the second insulating layer 102b or at the interface with another insulating layer, it is effective that the electron trap layer 102 is formed using three insulating layers as illustrated in FIG. 1C, that the electron affinity of the third insulating layer 102c is smaller than that of the second insulating layer 102b, and that the bandgap of the third insulating layer 102c is larger than that of the second insulating layer 102b.

In this case, if the physical thickness of the third insulating layer 102c is large enough, electrons trapped by the electron trap states 106 can be held even when the second insulating layer 102b has a small thickness. As a material of the third insulating layer 102c, the same material as or a material similar to that of the first insulating layer 102a can be used. Alternatively, a material whose constituent elements are the same as those of the second insulating layer 102b but the number of electron trap states is small enough may be used. The number (density) of electron trap states depends on the formation method.

Figure 3C:
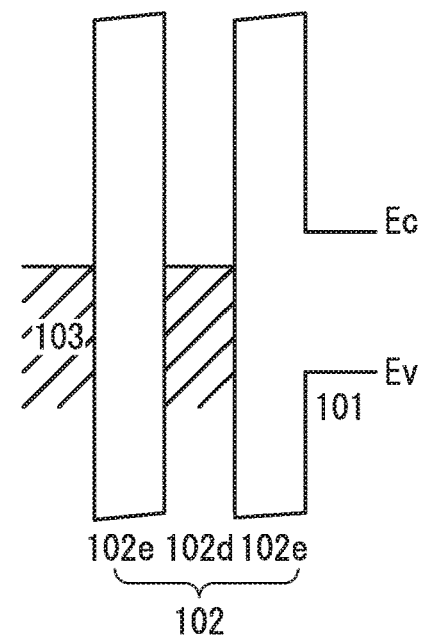
Figure 3D:
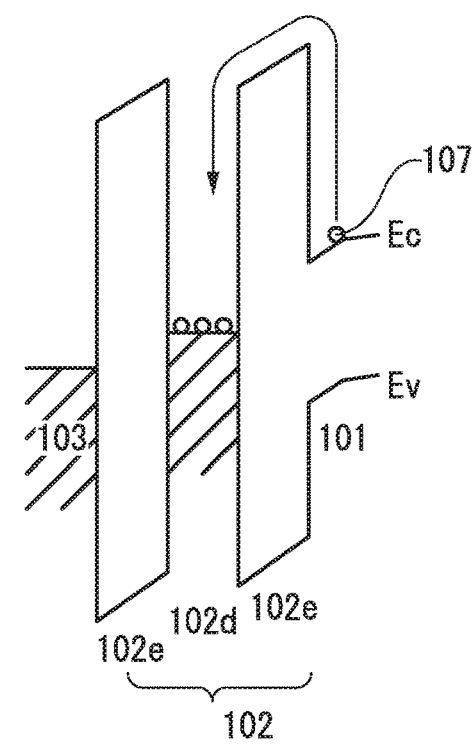

Note that when the electrically insulated conductive layer 102d is surrounded by the insulator 102e as illustrated in FIG. 2, electrons are trapped in the conductive layer 102d according to the above principle. FIGS. 3C and 3D illustrate the examples. In FIG. 3C, the potential of the gate electrode 103 is equal to that of the source or drain electrode.

FIG. 3D shows the state where the potential of the gate electrode 103 is higher than the potential of the source or drain electrode. Electrons that exist in the semiconductor layer 101 move toward the gate electrode 103 having a higher potential. Some of the electrons moving from the semiconductor layer 101 toward the gate electrode 103 are trapped in the conductive layer 102d. In other word, in the semiconductor device illustrated in FIG. 2, the conductive layer 102d functions as the electron trap states 106 in the semiconductor device in FIG. 1B.

Note that when the work function of the conductive layer 102d is large, an energy barrier to the insulator 102e is high and consequently the trapped electrons can be prevented from moving out from the conductive layer 102d.

In the above structure, each of the first to third insulating layers 102a to 102c may be composed of a plurality of insulating layers. A plurality of insulating layers containing the same constituting elements and formed by different formation methods may be used.

For example, when the first and second insulating layers 102a and 102b are formed using insulating layers composed of the same constituting elements (e.g., hafnium oxide), the first insulating layer 102a may be formed by a chemical vapor deposition (CVD) method or an atomic layer deposition (ALD) method and the second insulating layer 102b may be formed by sputtering.

Examples of the CVD method that can be used here are a thermal CVD method, a photo CVD method, a plasma CVD (PECVD) method, a metal organic CVD (MOCVD) method, or a low pressure CVD (LPCVD) method. Thus, insulating films may be formed by different CVD methods.

In general, an insulating layer formed by sputtering includes more defects and stronger electron trapping characteristics than an insulating layer formed by CVD or ALD. From this reason, the second insulating layer 102b may be formed by sputtering and the third insulating layer 102c may be formed by CVD or ALD when the second and third insulating layers 102b and 102c contain the same constituent elements.

When the second insulating layer 102b is formed using a plurality of insulating layers containing the same constituent elements, one insulating layer may be formed by sputtering and another insulating layer may be formed by CVD or ALD.

As described above, the threshold of a semiconductor device is increased by the trap of electrons in the electron trap layer 102. In particular, when the semiconductor layer 101 is formed using a wide bandgap material, a source-drain current (cut-off current, Icut) when the potential of the gate electrodes 103 and 105 is equal to the potential of the source electrode can be significantly decreased.

For example, the Icut density (a current value per micrometer of a channel width) of an In—Ga—Zn-based oxide whose bandgap is 3.2 eV is 1 zA/μm ($1\times10^{-21}$ A/μm) or less, typically 1 yA/μm ($1\times10^{-24}$ A/μm) or less.

Figure 4A:
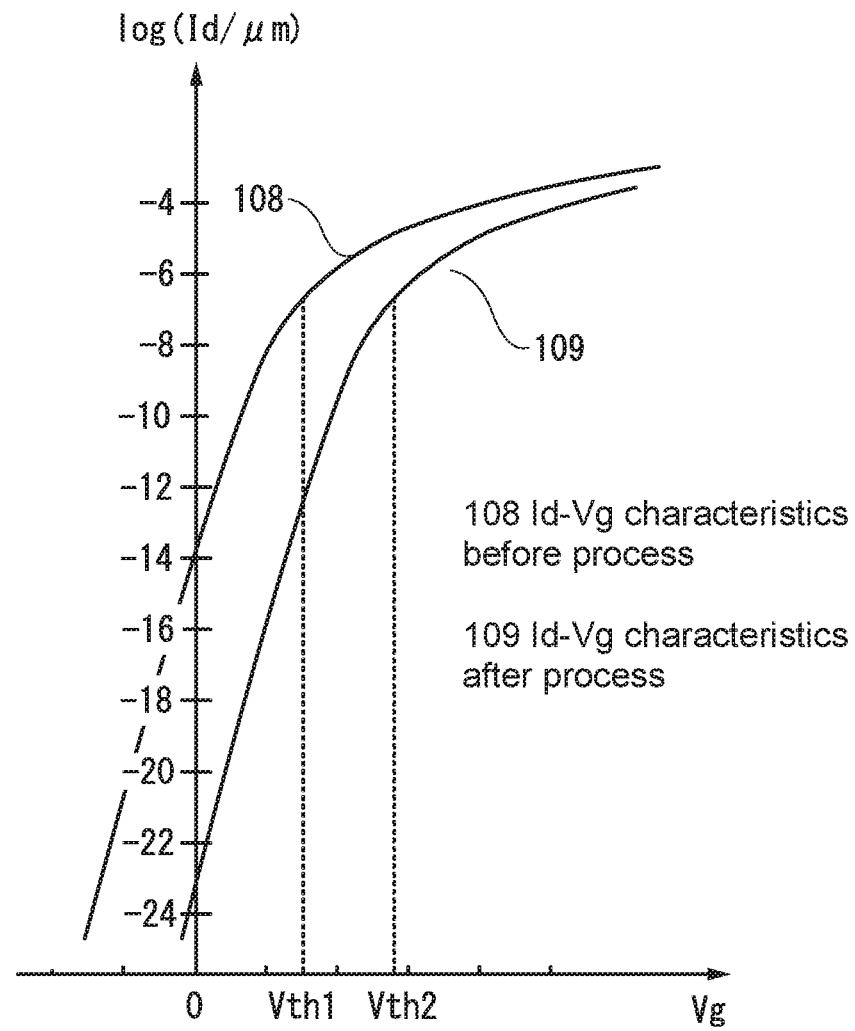
FIG. 4A schematically shows characteristics of a semiconductor device of an embodiment and FIG. 4B illustrates an example of a circuit in which the semiconductor device is used.

FIG. 4A schematically shows dependence of current per micrometer of channel width (Id) between source and drain electrodes on the potential of the gate electrode 105 (Vg) at room temperature, before and after electron trap in the electron trap layer 102. Note that each potential of the source electrode and the gate electrode 103 is 0 V and the potential of the drain electrode is +1 V. Although current smaller than 1 fA cannot be measured directly, it can be estimated from a value measured by another method, the subthreshold value, and the like. Note that Example is referred to for the measurement method.

As indicated by a curve 108, the threshold of the semiconductor device is Vth1 at first. After electron trapping, the threshold is increased (shifts in the positive direction) to become Vth2. As a result, the current density when Vg=0 becomes 1 aA/μm ($1\times10^{-}$ A/μm) or less, for example, greater than or equal to 1 zA/μm and less than or equal to 1 yA/μm.

Figure 4B:
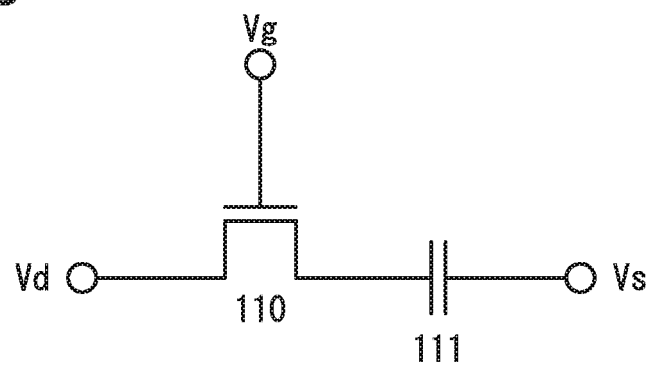

FIG. 4B illustrates a circuit in which charge stored in a capacitor 111 is controlled by a transistor 110. Leakage current between electrodes of the capacitor 111 is ignored. The capacitance of the capacitor 111 is 1 fF, the potential of the capacitor 111 on the transistor 110 side is +1 V, and the potential of Vd is 0 V.

The curve 108 in FIG. 4A denotes the Id-Vg characteristics of the transistor 110 and the channel width is 0.1 μm, in which case the Icut is approximately $1\times10^{-15}$ A (approximately 1 fA) and the resistivity of the transistor 110 at this time is approximately $1\times10^{15}$ Ω. Accordingly, the time constant of a circuit composed of the transistor 110 and the capacitor 111 is approximately one second. This means that most of the charge stored in the capacitor 111 is lost in approximately one second.

The curve 109 in FIG. 4A denotes the Id-Vg characteristics of the transistor 110 and the channel width is 0.1 m, in which case the Icut is approximately $1\times10^{-24}$ A (approximately 1 yA) and the resistivity of the transistor 110 at this time is approximately $1\times10^{24}$ Ω. Accordingly, the time constant of the circuit composed of the transistor 110 and the capacitor 111 is approximately $1\times10^{9}$ seconds (=approximately 31 years). This means that one-third of the charge stored in the capacitor 111 is left after 10 years.

From this, charge can be held for 10 years in a simple circuit composed of a transistor and a capacitor without applying such a large voltage. This can be applied to various kinds of memory devices, such as a memory cell shown in FIGS. 5A and 5B.

Figure 5A:
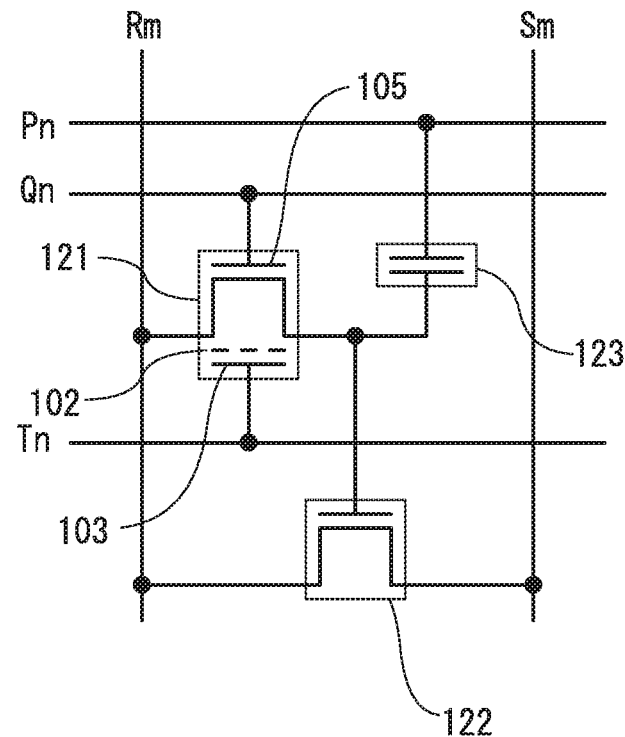
FIGS. 5A and 5B illustrate examples of a memory cell of an embodiment.

The memory cell illustrated in FIG. 5A includes a transistor 121, a transistor 122, and a capacitor 123. The transistor 121 includes the electron trap layer 102 as illustrated in FIG. 1A. After the circuit is formed, the above-described process for increasing the threshold is performed to lower Icut. Note that in the drawing, the transistor with the changed threshold due to electrons in the electron trap layer 102 is represented by a symbol that is different from the symbol for a normal transistor.

Memory cells in FIG. 5A are formed in a matrix. For example, to the memory cell in the n-th row and m-th column, a read word line Pn, the write word line Qn, the threshold correction line Tn, the bit line Rm, and the source line Sm are connected. Note that all the threshold correction wirings may be arranged to be connected to each other to have the same potential.

The threshold correction can be performed as follows. First, potentials of all read word lines, all write word lines, all source lines, and all bit lines are set at 0 V. Then, a wafer or chip over which the memory cells are formed is set at an appropriate temperature and the potentials of all the threshold correction lines are set at an appropriate value (e.g., +3 V), and these conditions are held for an appropriate period. In this way, the threshold becomes an appropriate value.

Figure 5B:
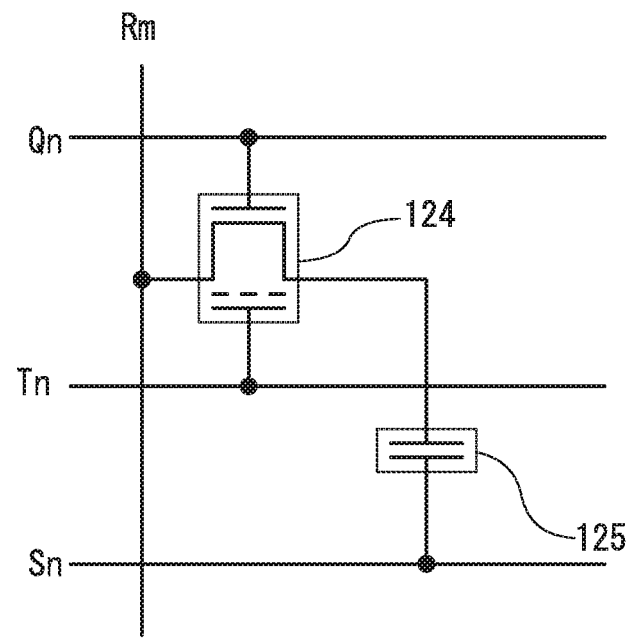

Note that the memory cell may have a structure including a transistor 124 and a capacitor 125 as illustrated in FIG. 5B. For example, to the memory cell in the n-th row and m-th column, the word line Qn, the threshold correction line Tn, the bit line Rm, and the source line Sn are connected. The method for adjusting the threshold can be similar to that in the case of FIG. 5A.

When the threshold is adjusted to an appropriate value by making the electron trap layer trap electrons as described above, it is preferable to avoid further addition of electrons to the electron trap layer in normal use after that. For example, further addition of electrons means a further increase of threshold, resulting in circuit deterioration.

When the electron trap layer is in the vicinity of a semiconductor layer, and a wiring or an electrode whose potential is higher than that of the semiconductor layer faces the semiconductor layer with the electron trap layer sandwiched therebetween, electrons might be trapped in the electron trap layer in normal use.

To suppress this, the potential of the threshold control wiring Tn is preferably set lower than or equal to the lowest potential of the bit line Rm in the memory cell shown in FIG. 5A or 5B.

Figure 6A:
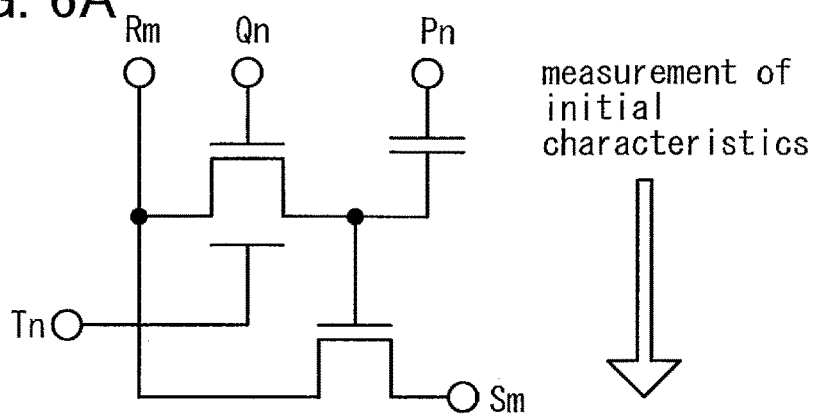
FIGS. 6A to 6C illustrate a manufacturing process of a semiconductor device.
Figure 6B:
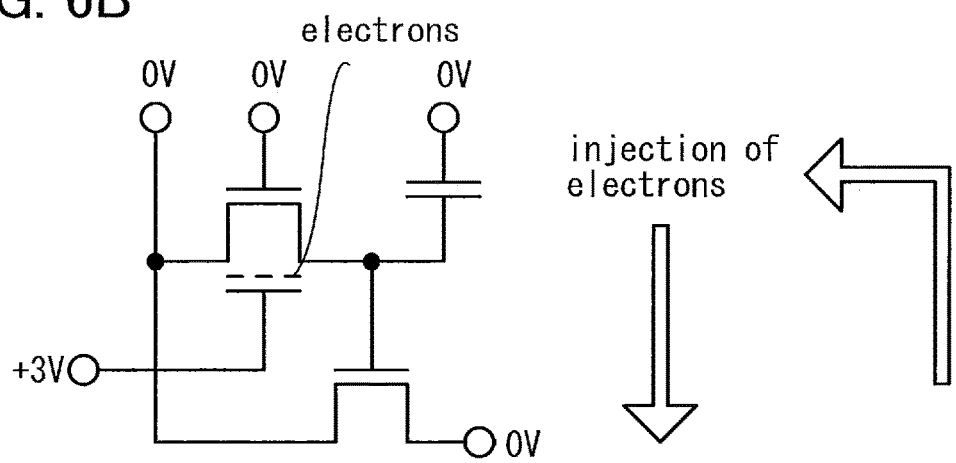
Figure 6C:
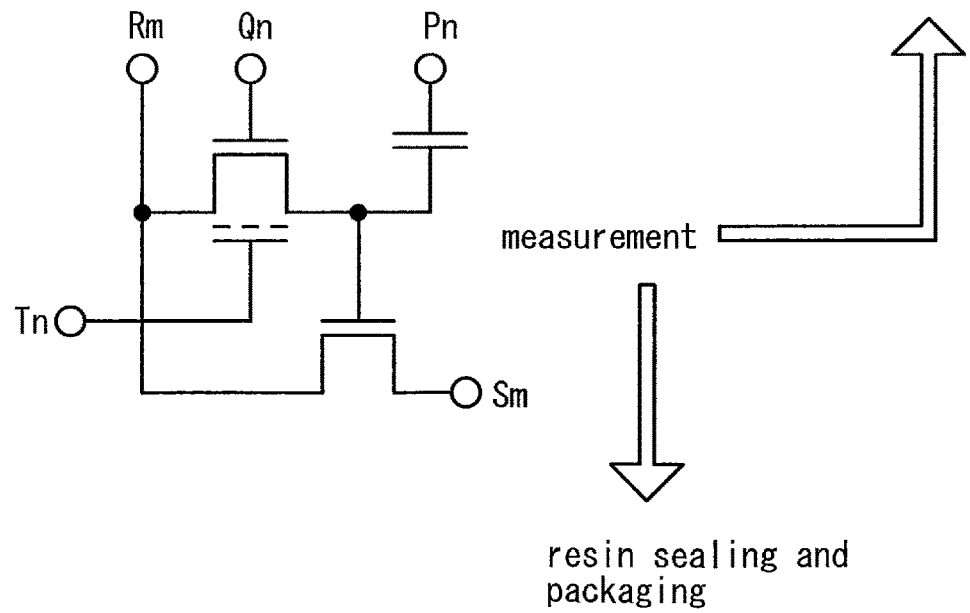

For example, steps illustrated in FIGS. 6A to 6C can be performed. After memory cells are formed, first, initial characteristics are measured to select a conforming item (see FIG. 6A). Here, items without malfunctions that cannot be recovered due to a break in a wire or the like are regarded as conforming items. At this stage, the threshold has not been corrected to an appropriate value and thus charge in the capacitor cannot be held for a long time; however, this is not the criteria of selection.

Then, electrons are injected as illustrated in FIG. 6B. An appropriate number of electrons are trapped in the electron trap layer 102. This operation is performed in the above-described manner. If all of the threshold control lines are connected, a pad is provided for the chip to supply a potential via the pad. At this stage, the difference between the potential of the gate electrode 103 and the potential of the one with the lower potential of the source electrode and the drain electrode (gate voltage) is more than or equal to 1 V and less than 4V and, in addition, less than or equal to the difference between the potential of the gate electrode 105 and the potential of the one with the lower potential of the source electrode and the drain electrode after shipment of this memory cell.

Then, measurement is performed again as illustrated in FIG. 6C. One of the criteria for conforming items is the threshold increased as planned. At this stage, chips with a threshold abnormality are regarded as nonconforming items, and these chips may again be subjected to electron injection. Conforming items are shipped after dicing, resin sealing, and packaging.

The degree of the threshold increase depends on the density of electrons trapped by the electron trap layer 102. For example, in the semiconductor device illustrated in FIG. 1B, in the case where electrons are trapped only at the interface between the first insulating layer 102a and the second insulating layer 102b, the threshold is increased by Q/C, where Q is the surface density of trapped electrons and C is the dielectric constant of the first insulating layer 102a.

As described above, the potential of the gate electrode 103 determines the value at which the number of trapped electrons converges. Accordingly, the degree of the threshold increase can be adjusted by the potential of the gate electrode 103.

As an example, a case in which the potential of the gate electrode 103 is set higher than the potentials of the source electrode and the drain electrode by 1.5 V and the temperature is set at 150° C. to 250° C., typically 200° C.±20° C. is considered. Assuming that the threshold of the semiconductor device before electrons are trapped in the electron trap layer 102 (first threshold, Vth1) is +1.1 V, a channel is formed in the semiconductor layer 101 at first and electrons are trapped in the electron trap layer 102. Then, the number of trapped electrons in the electron trap layer 102 increases, and the channel disappears. At this stage, trap of electrons in the electron trap layer 102 stops.

In this case, because the channel disappears when the potential of the gate electrode 103 is higher than the potentials of the source electrode and the drain electrode by +1.5 V, the threshold voltage becomes +1.5 V. It can also be said that the threshold voltage is increased by 0.4 V by electrons trapped in the electron trap layer 102. The threshold that has been changed by electrons trapped in the electron trap layer 102 is referred to as a second threshold (Vth2).

By utilizing these characteristics, the thresholds of a plurality of semiconductor devices which are initially largely different from each other can converge at values within an appropriate range. For example, if three semiconductor devices with the first threshold voltages of +1.2 V, +1.1 V, and +0.9 V are subjected to the process under above-described conditions, trap of electrons does not make the threshold voltage to become significantly higher than +1.5 V in each semiconductor device; the second threshold voltage of each semiconductor device can become approximately +1.5 V. In this case, the number of trapped electrons in the electron trap layer 102 (e.g., the surface density of electrons) varies among the three semiconductor devices.

Note that the number of electrons trapped in the electron trap layer 102 also depends on the length of time for the threshold adjust process and thus a desired threshold can be obtained by adjusting time for the threshold adjust process.

Any of a variety of materials can be used for the gate electrode 103. For example, a conductive layer of Al, Ti, Cr, Co, Ni, Cu, Y, Zr, Mo, Ru, Ag, Ta, W, or the like can be used. The gate electrode 103 may have a stacked-layer structure of any of these materials. Alternatively, a conductive layer containing nitrogen may be used for the gate electrode 103. For example, a titanium nitride layer over which a tungsten layer is stacked, a tungsten nitride layer over which a tungsten layer is stacked, a tantalum nitride layer over which a tungsten layer is stacked, or the like can be used as the gate electrode 103.

Note that the work function of the gate electrode 103 that faces the semiconductor layer 101 is one factor determining the threshold of the semiconductor device; in general, as the work function of a material is smaller, the threshold becomes lower. However, as described above, the threshold can be adjusted by adjusting the number of trapped electrons in the electron trap layer 102; accordingly, the range of choices for the material of the gate electrode 103 can be widened.

Any of a variety of materials can be used for the semiconductor layer 101. For example, other than silicon, germanium, and silicon germanium, any of a variety of oxide semiconductors described later can be used.

Any of a variety of materials can be used for the first insulating layer 102a. For example, an insulating layer containing one or more kinds selected from magnesium oxide, silicon oxide, silicon oxynitride, silicon nitride oxide, silicon nitride, gallium oxide, germanium oxide, yttrium oxide, zirconium oxide, lanthanum oxide, neodymium oxide, and tantalum oxide can be used.

The second insulating layer 102b can be an insulating layer containing one or more kinds selected from hafnium oxide, aluminum oxide, tantalum oxide, aluminum silicate, and the like, for example.

The third insulating layer 102c can be an insulating layer containing one or more kinds selected from magnesium oxide, silicon oxide, silicon oxynitride, silicon nitride oxide, silicon nitride, gallium oxide, germanium oxide, yttrium oxide, zirconium oxide, lanthanum oxide, neodymium oxide, and tantalum oxide, for example.

The conductive layer 102d can be formed using any kind of materials. For example, a conductive layer of Al, Ti, Cr, Co, Ni, Cu, Y, Zr, Mo, Ru, Ag, Ta, W, Pt, Pd, or the like can be used. The conductive layer 102d may have a stacked-layer structure of any of these materials. Alternatively, a conductive layer containing nitrogen may be used as the conductive layer 102d.

In particular, as a material having a large work function, a metal of the platinum group such as platinum or palladium: a nitride such as indium nitride, zinc nitride, In—Zn-based oxynitride, In—Ga-based oxynitride, or In—Ga—Zn-based oxynitride; or the like may be used.

Any of a variety of materials can be used for the insulator 102e. For example, silicon oxide, silicon nitride, silicon oxynitride, silicon nitride oxide, aluminum oxide, or tantalum oxide can be used.

Thus, the semiconductor device in which a necessary number of electrons are trapped in the electron trap layer 102 is the same as a normal MOS semiconductor device. When the semiconductor device is used as a MOS semiconductor device, it is preferable that the potential of the gate electrode 103 be always set at the lowest potential in the circuit.

Note that the timing of the process for trapping electrons in the electron trap layer 102 is not limited to that described above and may be any of the following timings before leaving the factory, for example: after formation of wiring metal connected to the source electrode or the drain electrode of the semiconductor device, after backplane process (wafer process), after wafer dicing, and after packaging. In either case, it is preferable that the semiconductor device be not exposed to temperatures of 125° C. or higher for one hour or more after the process for trapping electrons.

Embodiment 2

In this embodiment, a semiconductor device which is one embodiment of the present invention is described with reference to drawings. Although a transistor in which a threshold control gate electrode exists between a substrate and a semiconductor layer is described below, a transistor in which a semiconductor layer exists between a threshold control gate electrode and a substrate may be used.

Figure 7A:
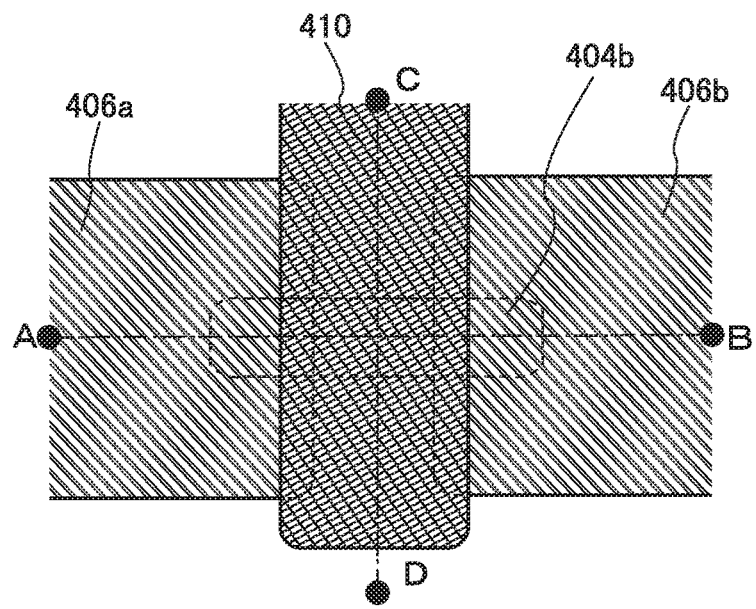
FIGS. 7A to 7C are a top view and cross-sectional views of a transistor.
Figure 7B:
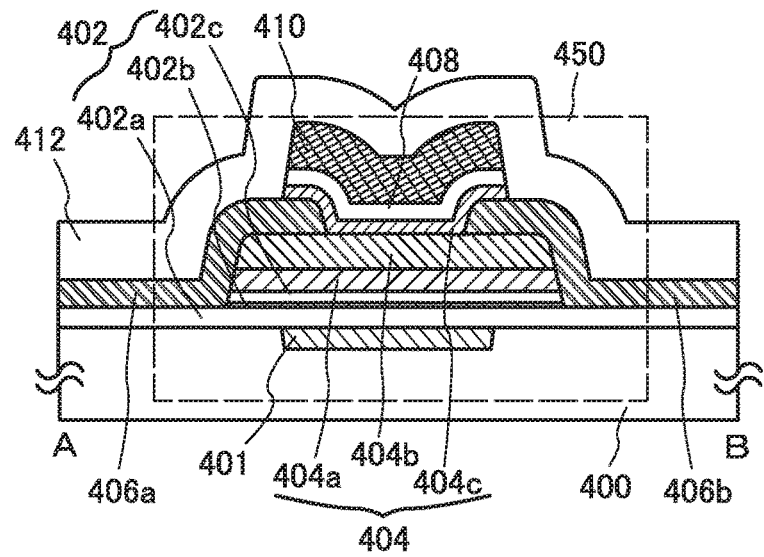
Figure 7C:
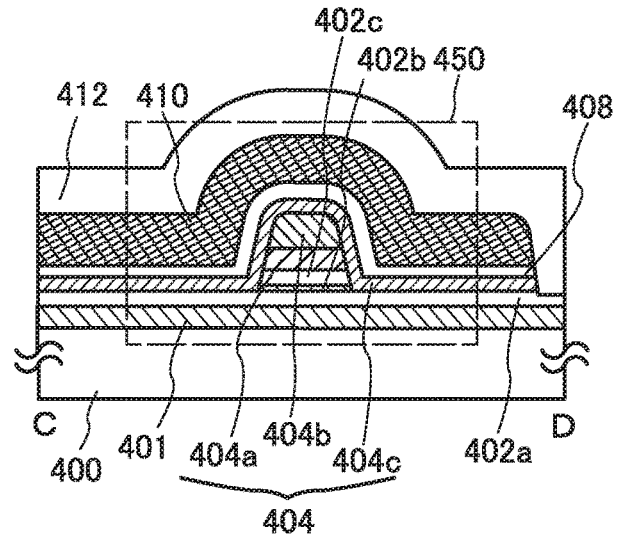

FIGS. 7A to 7C are a top view and cross-sectional views illustrating a transistor of one embodiment of the present invention. FIG. 7A is the top view. FIG. 7B illustrates a cross section taken along the dashed-dotted line A-B in FIG. 7A, and FIG. 7C illustrates a cross section taken along the dashed-dotted line C-D in FIG. 7A. Note that for drawing simplicity, some components are not illustrated in the top view of FIG. 7A. The direction of the dashed-dotted line A-B and the direction of the dashed-dotted line C-D may be referred to as a channel length direction and a channel width direction, respectively.

The transistor 450 in FIGS. 7A to 7C includes a gate electrode 401 embedded in a substrate 400; a base insulating layer 402 including a projection and a depression over the substrate 400 and the gate electrode 401; an oxide semiconductor layer 404a and an oxide semiconductor layer 404b over the projection of the base insulating layer 402; a source electrode 406a and a drain electrode 406b over the oxide semiconductor layer 404a and the oxide semiconductor layer 404b; an oxide semiconductor layer 404c in contact with the depression of the base insulating layer 402, a side surface of the projection (depression) of the base insulating layer 402, a side surface of the oxide semiconductor layer 404a, a side surface and a top surface of the oxide semiconductor layer 404b, the source electrode 406a, and the drain electrode 406b; a gate insulating layer 408 over the oxide semiconductor layer 404c; a gate electrode 410 provided over and in contact with the gate insulating layer 408 and facing the top surface and the side surface of the oxide semiconductor layer 404b, and an oxide insulating layer 412 over the source electrode 406a, the drain electrode 406b, and the gate electrode 410.

The base insulating layer 402 includes a first insulating layer 402a, a second insulating layer 402b, and a third insulating layer 402c and functions as the electron trap layer described in Embodiment 1. The oxide semiconductor layers 404a, 404b, and 404c are collectively referred to as a multilayer semiconductor layer 404.

In the case where a material used as the second insulating layer 402b has a high relative dielectric constant, the second insulating layer 402b can be formed thick. For example, in the case of using hafnium oxide with a relative dielectric constant of 16, the second insulating layer 402b can be formed approximately four times as thick as the second insulating layer 402b using silicon oxide with a relative dielectric constant of 3.9. The increase in the thickness of the second insulating layer 402b is preferable in terms of preventing the leakage of trapped electrons. Note that each thickness of the first insulating layer 402a and the third insulating layer 402c is more than or equal to 1 nm and less than or equal to 30 nm, preferably more than or equal to 10 nm and less than or equal to 20 nm. The thickness of the second insulating layer 402b is more than or equal to 1 nm and less than or equal to 100 nm, preferably more than or equal to 5 nm and less than or equal to 20 nm.

Note that the channel length refers to the distance between a source (a source region, source electrode) and a drain (drain region, drain electrode) in a region where a semiconductor layer overlaps with a gate electrode in the top view. That is, the channel length in FIG. 7A is the distance between the source electrode 406a and the drain electrode 406b in the region where the oxide semiconductor layer 404b overlaps with the gate electrode 410. The channel width refers to the width of a source or a drain in a region where a semiconductor layer overlaps with a gate electrode. That is, the channel width in FIG. 7A is the width of the source electrode 406a or the drain electrode 406b in the region where the semiconductor layer 404b overlaps with the gate electrode 410.

When the base insulating layer 402 functions as an electron trap layer, electrons can be trapped in electron trap states existing at the interface between the third insulating layer 402c and the second insulating layer 402b or inside the second insulating layer 402 as described in Embodiment 1.

The number of electrons trapped in the electron trap states can be adjusted by the potential of the gate electrode 401.

The gate electrode 410 electrically covers the oxide semiconductor layer 404b, increasing the on-state current. This transistor structure is referred to as a surrounded channel (s-channel) structure. In the s-channel structure, a current flows through an entire region of the oxide semiconductor layer 404b (bulk). Since a current flows through the oxide semiconductor layer 404b, an adverse effect of interface scattering is unlikely to occur, leading to a high on-state current. Note that as the oxide semiconductor layer 404b is thicker, the on-state current can be increased.

In formation of a transistor with a short channel length and a short channel width, when an electrode, a semiconductor layer, or the like is processed at the same time when a resist mask is recessed, the electrode, the semiconductor layer, or the like has a rounded upper end portion (curved surface) in some cases. With this structure, the coverage with the gate insulating layer 408, the gate electrode 410, and the oxide insulating layer 412, which are to be formed over the oxide semiconductor layer 404b, can be improved. In addition, electric field concentration that might occur at end portions of the source electrode 406a and the drain electrode 406b can be reduced, which can suppress deterioration of the transistor.

By miniaturization of the transistor, a high degree of integration and a high density can be achieved. For example, the channel length of the transistor is less than or equal to 100 nm, preferably less than or equal to 40 nm, further preferably less than or equal to 30 nm, and still further preferably less than or equal to 20 nm, and the channel width of the transistor is less than or equal to 100 nm, preferably less than or equal to 40 nm, further preferably less than or equal to 30 nm, and still further preferably less than or equal to 20 nm. Even with such a small channel width, a transistor of one embodiment of the present invention can increase the on-state current by having the s-channel structure.

The substrate 400 is not limited to a simple supporting substrate, and may be a substrate where another device such as a transistor is formed. In that case, at least one of the gate electrode 410, the source electrode 406a, and the drain electrode 406b of the transistor 450 may be electrically connected to the above device.

The base insulating layer 402 can have a function of supplying oxygen to the multilayer semiconductor layer 404 as well as a function of preventing diffusion of impurities from the substrate 400. In the case where the substrate 400 is provided with another device as described above, the base insulating layer 402 also has a function as an interlayer insulating layer. In that case, since the base insulating layer 402 has an uneven surface, the base insulating layer 402 is preferably subjected to planarization treatment such as chemical mechanical polishing (CMP) treatment so as to have a flat surface.

The multilayer semiconductor layer 404 in the channel formation region of the transistor 450 has a structure in which the oxide semiconductor layer 404a, the oxide semiconductor layer 404b, and the oxide semiconductor layer 404c are stacked in this order from the substrate 400 side. The oxide semiconductor layer 404b is surrounded by the oxide semiconductor layer 404a and the oxide semiconductor layer 404c. As in FIG. 7C, the gate electrode 410 electrically covers the oxide semiconductor layer 404b.

Here, for the oxide semiconductor layer 404b, for example, an oxide semiconductor whose electron affinity (an energy difference between a vacuum level and the conduction band minimum) is higher than those of the oxide semiconductor layer 404a and the oxide semiconductor layer 404c is used. The electron affinity can be obtained by subtracting an energy difference between the conduction band minimum and the valence band maximum (what is called an energy gap) from an energy difference between the vacuum level and the valence band maximum (what is called an ionization potential).

The oxide semiconductor layer 404a and the oxide semiconductor layer 404c each contain one or more kinds of metal elements forming the oxide semiconductor layer 404b. For example, the oxide semiconductor layer 404a and the oxide semiconductor layer 404c are preferably formed using an oxide semiconductor whose conduction band minimum is closer to a vacuum level than that of the oxide semiconductor layer 404b by 0.05 eV or more, 0.07 eV or more, 0.1 eV or more, or 0.15 eV or more and 2 eV or less, 1 eV or less, 0.5 eV or less, or 0.4 eV or less.

In such a structure, when an electric field is applied to the gate electrode 410, a channel is formed in the oxide semiconductor layer 404b where the conduction band minimum is the lowest in the multilayer semiconductor layer 404. In other words, the oxide semiconductor layer 404c is formed between the oxide semiconductor layer 404b and the gate insulating layer 408, whereby a structure in which the channel of the transistor is provided in a region that is not in contact with the gate insulating layer 408 is obtained.

Further, since the oxide semiconductor layer 404a contains one or more metal elements contained in the oxide semiconductor layer 404b, an interface state is unlikely to be formed at the interface between the oxide semiconductor layer 404b and the oxide semiconductor layer 404a, compared with the interface between the oxide semiconductor layer 404b and the base insulating layer 402 on the assumption that the oxide semiconductor layer 404b is in contact with the base insulating layer 402. The interface state sometimes forms a channel, leading to a change in the threshold of the transistor. Thus, with the oxide semiconductor layer 404a, a variation in the electrical characteristics of the transistor, such as threshold, can be reduced. Further, the reliability of the transistor can be improved.

Furthermore, since the oxide semiconductor layer 404c contains one or more metal elements contained in the oxide semiconductor layer 404b, scattering of carriers is unlikely to occur at the interface between the oxide semiconductor layer 404b and the oxide semiconductor layer 404c, compared with the interface between the oxide semiconductor layer 404b and the gate insulating layer 408 on the assumption that the oxide semiconductor layer 404b is in contact with the gate insulating layer 408. Thus, with the oxide semiconductor layer 404c, the field-effect mobility of the transistor can be increased.

For the oxide semiconductor layer 404a and the oxide semiconductor layer 404c, for example, a material containing Al, Ti, Ga, Ge, Y, Zr, Sn, La, Ce, or Hf with a higher atomic ratio than that used for the oxide semiconductor layer 404b can be used. Specifically, an atomic ratio of any of the above metal elements in the oxide semiconductor layer 404a and the oxide semiconductor layer 404c is 1.5 times or more, preferably 2 times or more, further preferably 3 times or more as much as that in the oxide semiconductor layer 404b. Any of the above metal elements is strongly bonded to oxygen and thus has a function of suppressing generation of an oxygen vacancy in the oxide semiconductor layer 404a and the oxide semiconductor layer 404c. That is, an oxygen vacancy is less likely to be generated in the oxide semiconductor layer 404a and the oxide semiconductor layer 404c than in the oxide semiconductor layer 404b.

Note that when each of the oxide semiconductor layer 404a, the oxide semiconductor layer 404b, and the oxide semiconductor layer 404c is an In-M-Zn oxide containing at least indium, zinc, and M (M is a metal such as Al, Ti, Ga, Ge, Y, Zr, Sn, La, Ce, or Hf), and when the oxide semiconductor layer 404a has an atomic ratio of In to M and Zn which is $x_1:y_1:z_1$, the oxide semiconductor layer 404b has an atomic ratio of In to M and Zn which is $x_2:y_2:z_2$, and the oxide semiconductor layer 404c has an atomic ratio of In to M and Zn which is $x_3:y_3:z_3$, $y_1/x_1$ and $y_3/x_3$ is each preferably larger than $y_2/x_2$. $Y_1/x_1$ and $y_3/x_3$ is each 1.5 times or more, preferably 2 times or more, further preferably 3 times or more as large as $y_2/x_2$. At this time, when $y_2$ is greater than or equal to $x_2$ in the oxide semiconductor layer 404b, the transistor can have stable electrical characteristics. However, when $y_2$ is 3 times or more as large as $x_2$, the field-effect mobility of the transistor is reduced; accordingly, $y_2$ is preferably less than 3 times $x_2$.

3 In the case where Zn and O are not taken into consideration, the proportion of In and the proportion of M in the oxide semiconductor layer 404a and the oxide semiconductor layer 404c when summation of In and M is assumed to be 100 atomic % are preferably less than 50 atomic % and greater than or equal to 50 atomic %, respectively, and further preferably less than 25 atomic % and greater than or equal to 75 atomic %, respectively. In the case where Zn and O are not taken into consideration, the proportion of In and the proportion of M in the oxide semiconductor layer 404b when summation of In and M is assumed to be 100 atomic % are preferably greater than or equal to 25 atomic % and less than 75 atomic %, respectively, further preferably greater than or equal to 34 atomic % and less than 66 atomic %, respectively.

The thicknesses of the oxide semiconductor layer 404a and the oxide semiconductor layer 404c are each greater than or equal to 3 nm and less than or equal to 100 nm, preferably greater than or equal to 3 nm and less than or equal to 50 nm. The thickness of the oxide semiconductor layer 404b is greater than or equal to 3 nm and less than or equal to 200 nm, preferably greater than or equal to 3 nm and less than or equal to 100 nm, further preferably greater than or equal to 3 nm and less than or equal to 50 nm. In addition, the oxide semiconductor layer 404b is preferably thicker than the oxide semiconductor layer 404a and the oxide semiconductor layer 404c.

For the oxide semiconductor layer 404a, the oxide semiconductor layer 404b, and the oxide semiconductor layer 404c, an oxide semiconductor containing indium, zinc, and gallium can be used, for example. Note that the oxide semiconductor layer 404b preferably contains indium because carrier mobility can be increased.

Note that stable electrical characteristics can be effectively imparted to a transistor using an oxide semiconductor layer, by reducing the concentration of impurities in the oxide semiconductor layer to make the oxide semiconductor layer intrinsic or substantially intrinsic. The term "substantially intrinsic" refers to the state where an oxide semiconductor layer has a carrier density lower than $1 \times 10^{17}/cm^3$, preferably lower than $1 \times 10^{15}/cm^3$, further preferably lower than $1 \times 10^{13}/cm^3$.

In the oxide semiconductor layer, hydrogen, nitrogen, carbon, silicon, and a metal element other than main components of the oxide semiconductor layer are impurities. For example, hydrogen and nitrogen form donor levels to increase the carrier density. In addition, silicon in the oxide semiconductor layer forms an impurity level. The impurity level might become a trap, so that the electrical characteristics of the transistor might deteriorate. Accordingly, in the oxide semiconductor layer 404a, the oxide semiconductor layer 404b, and the oxide semiconductor layer 404c and at interfaces between these layers, the impurity concentration is preferably reduced.

In order to make the oxide semiconductor layer intrinsic or substantially intrinsic, in secondary ion mass spectrometry (SIMS), for example, the concentration of silicon at a certain depth of the oxide semiconductor layer or in a region of the oxide semiconductor layer is preferably lower than $1 \times 10^{19}$ atoms/$cm^3$, further preferably lower than $5 \times 10^{1}$ atoms/$cm^3$, still further preferably lower than $1 \times 10^{18}$ atoms/$cm^3$. Further, the concentration of hydrogen at a certain depth of the oxide semiconductor layer or in a region of the oxide semiconductor layer is preferably lower than or equal to $2 \times 10^{20}$ atoms/$cm^3$, further preferably lower than or equal to $5 \times 10^{19}$ atoms/$cm^3$, still further preferably lower than or equal to $1 \times 10^{19}$ atoms/$cm^3$, yet still further preferably lower than or equal to $5 \times 10^{18}$ atoms/$cm^3$. Further, the concentration of nitrogen at a certain depth of the oxide semiconductor layer or in a region of the oxide semiconductor layer is preferably lower than $5 \times 10^{19}$ atoms/$cm^3$, further preferably lower than or equal to $5 \times 10^{18}$ atoms/$cm^3$, still further preferably lower than or equal to $1 \times 10^{18}$ atoms/$cm^3$, yet still further preferably lower than or equal to $5 \times 10^{17}$ atoms/$cm^3$.

In the case where the oxide semiconductor layer includes crystals, high concentration of silicon or carbon might reduce the crystallinity of the oxide semiconductor layer. In order not to lower the crystallinity of the oxide semiconductor layer, for example, the concentration of silicon at a certain depth of the oxide semiconductor layer or in a region of the oxide semiconductor layer may be lower than $1 \times 10^{19}$ atoms/$cm^3$, preferably lower than $5 \times 10^{18}$ atoms/$cm^3$, further preferably lower than $1 \times 10^{18}$ atoms/$cm^3$. Further, the concentration of carbon at a certain depth of the oxide semiconductor layer or in a region of the oxide semiconductor layer may be lower than $1 \times 10^{19}$ atoms/$cm^3$, preferably lower than $5 \times 10^{18}$ atoms/$cm^3$, further preferably lower than $1 \times 10^{18}$ atoms/$cm^3$ for example.

A transistor in which the above-described highly purified oxide semiconductor layer is used for a channel formation region has an extremely low off-state current. In the case where the voltage between a source and a drain is set at about 0.1 V, 5 V, or 10 V, for example, the off-state current standardized on the channel width of the transistor can be as low as several yoctoamperes per micrometer to several zeptoamperes per micrometer.

Note that as the gate insulating layer of the transistor, an insulating layer containing silicon is used in many cases; thus, it is preferable that, as in the transistor of one embodiment of the present invention, a region of the multilayer semiconductor layer, which serves as a channel, be not in contact with the gate insulating layer for the above-described reason. In the case where a channel is formed at the interface between the gate insulating layer and the multilayer semiconductor layer, scattering of carriers occurs at the interface, whereby the field-effect mobility of the transistor may be reduced. Also from the view of the above, it is preferable that the region of the multilayer semiconductor layer, which serves as a channel, be separated from the gate insulating layer.

Accordingly, with the multilayer semiconductor layer 404 having a stacked structure of the oxide semiconductor layers 404a, 404b, and 404c, a channel can be formed in the oxide semiconductor layer 404b; thus, the transistor can have high field-effect mobility and stable electrical characteristics.

Next, the band structure of the multilayer semiconductor layer 404 is described. For analyzing the band structure, a stacked film corresponding to the multilayer semiconductor layer 404 is formed. In the stacked film, In—Ga—Zn oxide with an energy gap of 3.5 eV is used for layers corresponding to the oxide semiconductor layer 404a and the oxide semiconductor layer 404c, and In—Ga—Zn oxide with an energy gap of 3.15 eV is used for a layer corresponding to the oxide semiconductor layer 404b.

The thickness of each of the oxide semiconductor layer 404a, the oxide semiconductor layer 404b, and the oxide semiconductor layer 404c was 10 nm. The energy gap was measured with the use of a spectroscopic ellipsometer (UT-300 manufactured by HORIBA Jobin Yvon). Further, the energy difference between the vacuum level and the valence band maximum was measured using an ultraviolet photoelectron spectroscopy (UPS) device (VersaProbe, ULVAC-PHI. Inc.).

Figure 8A:
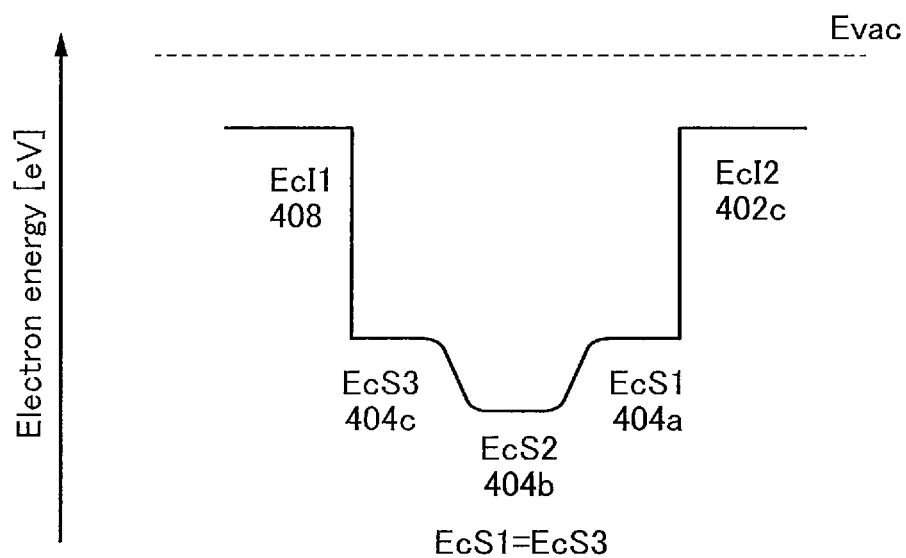
FIGS. 8A and 8B are schematic band diagrams of stacked semiconductor layers.

FIG. 8A is part of a schematic band structure showing an energy difference (electron affinity) between the vacuum level and the conduction band minimum of each layer, which is calculated by subtracting the energy gap from the energy difference between the vacuum level and the valence band maximum. FIG. 8A is a band diagram showing the case where silicon oxide layers are provided in contact with the oxide semiconductor layer 404a and the oxide semiconductor layer 404c. Here, Evac represents energy of the vacuum level, EcI1 and EcI2 represent the conduction band minimum of the silicon oxide layer, EcS1 represents the conduction band minimum of the oxide semiconductor layer 404a, EcS2 represents the conduction band minimum of the oxide semiconductor layer 404b, and EcS3 represents the conduction band minimum of the oxide semiconductor layer 404c.

As shown in FIG. 8A, the conduction band minimum continuously varies among the oxide semiconductor layer 404a, the oxide semiconductor layer 404b, and the oxide semiconductor layer 404c. This can be understood also from the fact that the constituent elements are common among the oxide semiconductor layer 404a, the oxide semiconductor layer 404b, and the oxide semiconductor layer 404c and oxygen is easily diffused among the oxide semiconductor layers 404a to 404c. Accordingly, the oxide semiconductor layer 404a, the oxide semiconductor layer 404b, and the oxide semiconductor layer 404c have a continuous physical property although they have different compositions in a stack.

The multilayer semiconductor layer 404 in which layers containing the same main components are stacked is formed to have not only a simple stacked-layer structure of the layers but also a continuous energy band (here, in particular, a well structure having a U shape in which the conduction band minimum continuously varies among the layers). In other words, the stacked-layer structure is formed such that there exist no impurities that form a defect level such as a trap center or a recombination center at each interface. If impurities exist between the stacked layers in the multilayer semiconductor layer, the continuity of the energy band is lost and carriers at the interface disappear by a trap or recombination.

Note that FIG. 8A shows the case where EcS1 and EcS3 are equal to each other; however, EcS1 and EcS3 may be different from each other. For example, part of the band structure in the case where EcS1 is higher than EcS3 is shown in FIG. 8B.

For example, when EcS1 is equal to EcS3, an In—Ga—Zn oxide whose atomic ratio of In to Ga and Zn is 1:3:2, 1:3:3, 1:3:4, 1:6:4, or 1:9:6 can be used for the oxide semiconductor layer 404a and the oxide semiconductor layer 404c and an In—Ga—Zn oxide whose atomic ratio of In to Ga and Zn is 1:1:1 or 3:1:2 can be used for the oxide semiconductor layer 404b. Further, when EcS1 is higher than EcS3, an In—Ga—Zn oxide whose atomic ratio of In to Ga and Zn is 1:6:4 or 1:9:6 can be used for the oxide semiconductor layer 404a, an In—Ga—Zn oxide whose atomic ratio of In to Ga and Zn is 1:1:1 or 3:1:2 can be used for the oxide semiconductor layer 404b, and an In—Ga—Zn oxide whose atomic ratio of In to Ga and Zn is 1:3:2, 1:3:3, or 1:3:4 can be used for the oxide semiconductor layer 404c, for example.

Figure 8B:
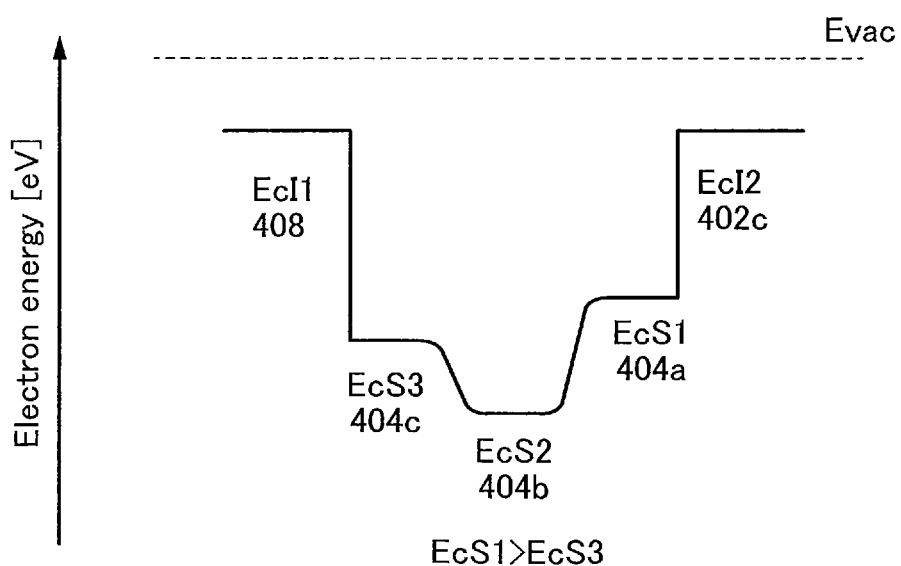

According to FIGS. 8A and 8B, the oxide semiconductor layer 404b of the multilayer semiconductor layer 404 serves as a well, so that a channel is formed in the oxide semiconductor layer 404b in a transistor including the multilayer semiconductor layer 404. Note that since the conduction band minimum continuously varies, the multilayer semiconductor layer 404 can also be referred to as a U-shaped well. Further, a channel formed to have such a structure can also be referred to as a buried channel.

Note that trap levels due to impurities or defects might be formed in the vicinity of the interface between the oxide semiconductor layers 404a and 404c and an insulating layer such as a silicon oxide layer. The oxide semiconductor layer 404b can be distanced away from the trap levels owing to existence of the oxide semiconductor layer 404a and the oxide semiconductor layer 404c. However, when the energy difference between EcS2 and EcS1 or between EcS2 and EcS3 is small, an electron in the oxide semiconductor layer 404b might reach the trap levels by passing over the oxide semiconductor layer 404a or the oxide semiconductor layer 404c. When electrons serving as negative fixed charges are trapped in the trap levels, the threshold of the transistor shifts in the positive direction.

Thus, to reduce a variation in the threshold voltage of the transistor, energy differences between EcS2 and each of EcS1 and EcS3 are necessary. Each of the energy differences is preferably greater than or equal to 0.1 eV, further preferably greater than or equal to 0.15 eV.

The oxide semiconductor layer 404a, the oxide semiconductor layer 404b, and the oxide semiconductor layer 404c preferably include crystal parts. In particular, when a crystal in which c-axes are aligned is used, the transistor can have stable electrical characteristics.

In the case where an In—Ga—Zn oxide is used for the multilayer semiconductor layer 404, it is preferable that the oxide semiconductor layer 404c contain less In than the oxide semiconductor layer 404b so that diffusion of In to the gate insulating layer is prevented.

For the source electrode 406a and the drain electrode 406b, a conductive material that can be bonded to oxygen is preferably used. For example, Al, Cr, Cu, Ta, Ti, Mo, or W can be used. Among the materials, in particular, it is preferable to use Ti which is easily bonded to oxygen or to use W with a high melting point, which allows subsequent process temperatures to be relatively high. Note that the conductive material that can be bonded to oxygen includes, in its category, a material to which oxygen is easily diffused.

When the conductive material that can be bonded to oxygen is in contact with a multilayer semiconductor layer, a phenomenon occurs in which oxygen in the multilayer semiconductor layer is diffused to the conductive material that can be bonded to oxygen. The phenomenon noticeably occurs when the temperature is high. Since the fabricating process of the transistor involves some heat treatment steps, the above phenomenon causes generation of oxygen vacancies in the vicinity of a region which is in the multilayer semiconductor layer and is in contact with the source electrode or the drain electrode. The oxygen vacancies bond to hydrogen that is slightly contained in the layer, whereby the region is changed to an n-type region. Thus, the n-type region can serve as a source or a drain of the transistor.

In the case of forming a transistor with an extremely short channel length, an n-type region which is formed by the generation of oxygen vacancies might extend in the channel length direction of the transistor, causing a short circuit. In that case, the electrical characteristics of the transistor change, for example, the threshold voltage shifts to cause a state in which on and off states of the transistor cannot be controlled with the gate voltage (conduction state). Accordingly, when a transistor with an extremely short channel length is formed, it is not always preferable that a conductive material that can be bonded to oxygen be used for a source electrode and a drain electrode.

In such a case, a conductive material which is less likely to be bonded to oxygen than the above material is preferably used for the source electrode 406a and the drain electrode 406b. As the conductive material which is not easily bonded to oxygen, for example, a material containing tantalum nitride, titanium nitride, or ruthenium or the like can be used. Note that in the case where the conductive material is in contact with the oxide semiconductor layer 404b, the conductive materials may be stacked with the above-described conductive material which is easily bonded to oxygen.

The first insulating layer 402a, the third insulating layer 402c, and the gate insulating layer 408 can be formed using an insulating layer containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The second insulating layer 402b can be formed using an insulating layer containing one or more of hafnium oxide, aluminum oxide, aluminum silicate, and the like. Note that each thickness of the first insulating layer 402a and the third insulating layer 402c is more than or equal to 1 nm and less than or equal to 30 nm, preferably more than or equal to 10 nm and less than or equal to 20 nm. The thickness of the second insulating layer 402b is more than or equal to 1 nm and less than or equal to 20 nm, preferably more than or equal to 5 nm and less than or equal to 10 nm.

For the gate electrodes 401 and 410, a conductive layer formed using Al, Ti, Cr, Co, Ni, Cu. Y, Zr, Mo, Ru, Ag. Ta, W, or the like can be used. The gate electrodes 401 and 410 may be a stack including any of the above materials. Alternatively, a conductive layer containing nitrogen may be used for the gate electrodes 401 and 410. For example, the gate electrodes 401 and 410 can be a stack in which a tungsten layer is formed over a titanium nitride layer, a stack in which a tungsten layer is formed over a tungsten nitride layer, or a stack in which a tungsten layer is formed over a tantalum nitride layer.

The oxide insulating layer 412 may be formed over the gate insulating layer 408 and the gate electrode 410. The oxide insulating layer 412 can be formed using an insulating layer containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, and tantalum oxide. The oxide insulating layer 412 may be a stack including any of the above materials.

Here, the oxide insulating layer 412 preferably contains excess oxygen. An oxide insulating layer containing excess oxygen refers to an oxide insulating layer from which oxygen can be released by heat treatment or the like. The oxide insulating layer containing excess oxygen is preferably a layer in which the amount of released oxygen when converted into oxygen atoms is $1.0 \times 10^{19}$ atoms/cm$^3$ or more in thermal desorption spectroscopy analysis. Oxygen released from the oxide insulating layer can be diffused to the channel formation region in the multilayer semiconductor layer 404 through the gate insulating layer 408, so that oxygen vacancies formed in the channel formation region can be filled with the oxygen. In this manner, stable electrical characteristics of the transistor can be achieved.

High integration of a semiconductor device requires miniaturization of a transistor. However, it is known that miniaturization of a transistor causes deterioration of the electrical characteristics of the transistor. In particular, on-state current, which is directly caused by a decrease in channel width, is significantly reduced.

However, in the transistor of one embodiment of the present invention, as described above, the oxide semiconductor layer 404c is formed so as to cover a region where a channel is formed in the oxide semiconductor layer 404b, and a channel formation layer and the gate insulating layer are not in contact with each other. Accordingly, scattering of carriers at the interface between a channel formation layer and the gate insulating layer can be reduced and the on-state current of the transistor can be increased.

When the oxide semiconductor layer is formed to be intrinsic or substantially intrinsic, the field-effect mobility might be reduced because of a decrease in the number of carriers contained in the oxide semiconductor layer. However, in the transistor of one embodiment of the present invention, a gate electric field is applied to the oxide semiconductor layer in the side surface direction in addition to the perpendicular direction. That is, the gate electric field is applied to the whole of the oxide semiconductor layer, whereby current flows in the bulk of the oxide semiconductor layer. Consequently, a change in the electrical characteristics can be suppressed owing to the highly purified intrinsic oxide semiconductor layer and the field-effect mobility of the transistor can be increased.

In the transistor of one embodiment of the present invention, the oxide semiconductor layer 404b is formed over the oxide semiconductor layer 404a, so that an interface state is less likely to be formed. In addition, impurities do not enter the oxide semiconductor layer 404b from above and below because the oxide semiconductor layer 404b is an intermediate layer in a three-layer structure. With the structure in which the oxide semiconductor layer 404b is surrounded by the oxide semiconductor layer 404a and the oxide semiconductor layer 404c (or the oxide semiconductor layer 404b is electrically surrounded by the gate electrode 410), on-state current of the transistor is increased as described above, and in addition, threshold voltage can be stabilized and an S value can be reduced. Thus, Icut can be reduced and power consumption can be reduced. Furthermore, the threshold of the transistor becomes stable; thus, long-term reliability of the semiconductor device can be improved.

Figure 9A:
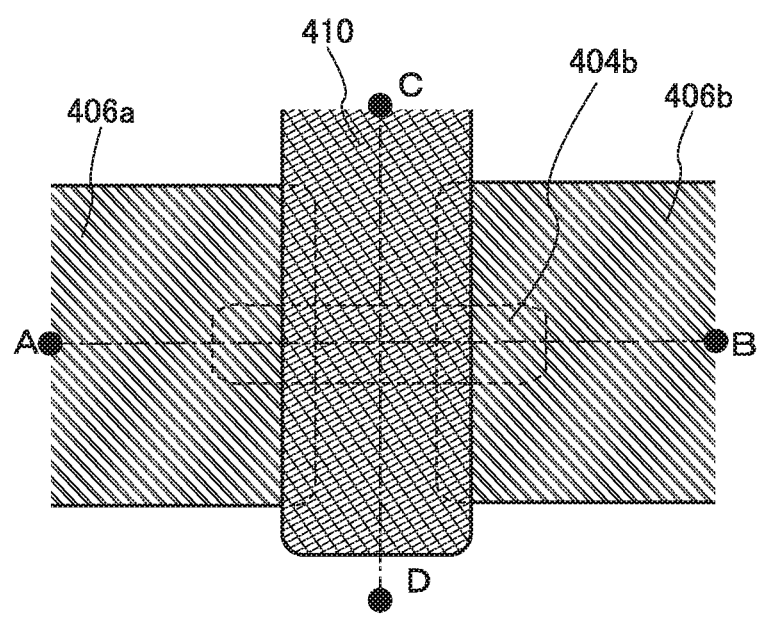
FIGS. 9A to 9C are a top view and cross-sectional views of a transistor.
Figure 9B:
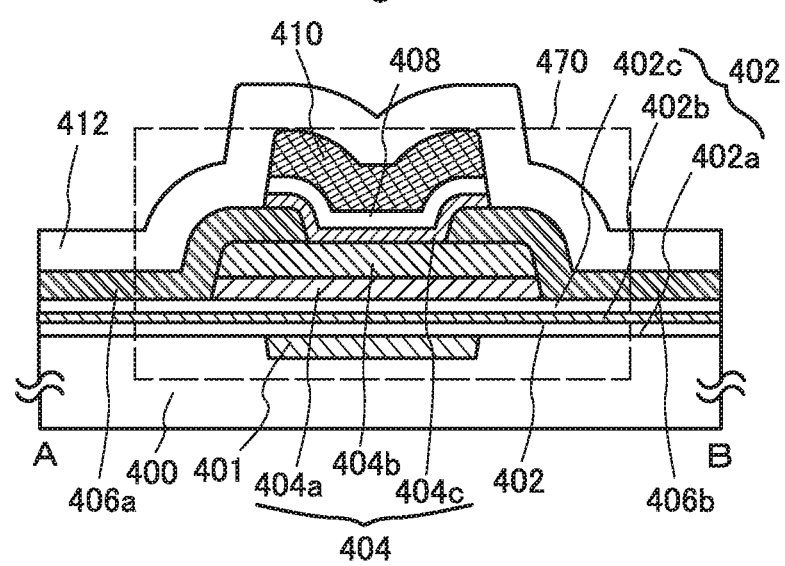
Figure 9C:
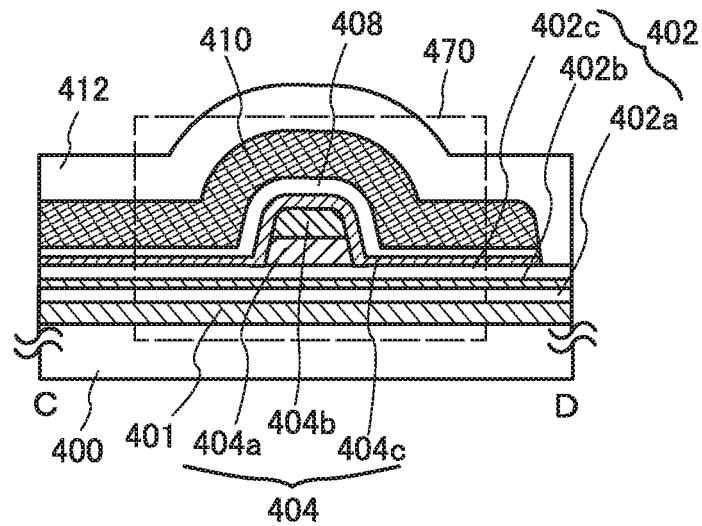

A transistor 470 illustrated in FIGS. 9A to 9C can be used. FIGS. 9A to 9C are a top view and cross-sectional views which illustrate the transistor 470. FIG. 9A is the top view. FIG. 9B illustrates a cross section taken along the dashed-dotted line A-B in FIG. 9A. FIG. 9C illustrates a cross section taken along the dashed-dotted line C-D in FIG. 9A.

Note that for simplification of the drawing, some components are not illustrated in the top view in FIG. 9A.

In the transistor 470, the base insulating layer 402 is not etched because overetching of a conductive layer to be the source electrode 406a and the drain electrode 406b does not occur when the source electrode 406a and the drain electrode 406b are formed.

To prevent the base insulating layer 402 from being etched by overetching of the conductive layer, the etching rate of the base insulating layer 402 is preferably set (sufficiently) lower than the etching rate of the conductive layer.

In this embodiment, although the oxide semiconductor layer 404b is sandwiched between the oxide semiconductor layer 404a and the oxide semiconductor layer 404c, without limited to this structure, one embodiment of the present invention may have a structure in which only the oxide semiconductor layer 404b is provided without the oxide semiconductor layer 404a and the oxide semiconductor layer 404c and is electrically covered with the gate electrode.

This embodiment can be combined with any of the other embodiments in this specification as appropriate.

Embodiment 3

In this embodiment, a method for forming the transistor 450, which is described in Embodiment 2 with reference to FIGS. 7A to 7C, is described with reference to FIGS. 10A to 10D and FIGS. 11A to 11C.

Figure 10A:
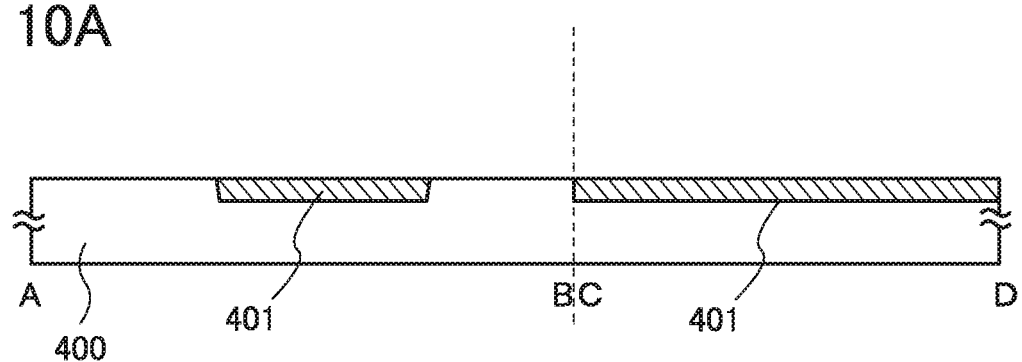
FIGS. 10A to 10D illustrate a method for manufacturing a transistor.

To form the gate electrode 401, a plurality of linear grooves is formed on the substrate 400, a conductive layer is deposited using Al, Ti, Cr, Co, Ni, Cu, Y, Zr, Mo, Ru, Ag, Ta, W. or an alloy material containing any of these as a main component, and is planarized and etched (see FIG. 10A). The conductive layer can be formed by sputtering, CVD, or the like.

For the substrate 400, a glass substrate, a ceramic substrate, a quartz substrate, a sapphire substrate, or the like can be used. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like may be used. Any of these substrates further provided with a semiconductor element thereover may be used.

Figure 10B:
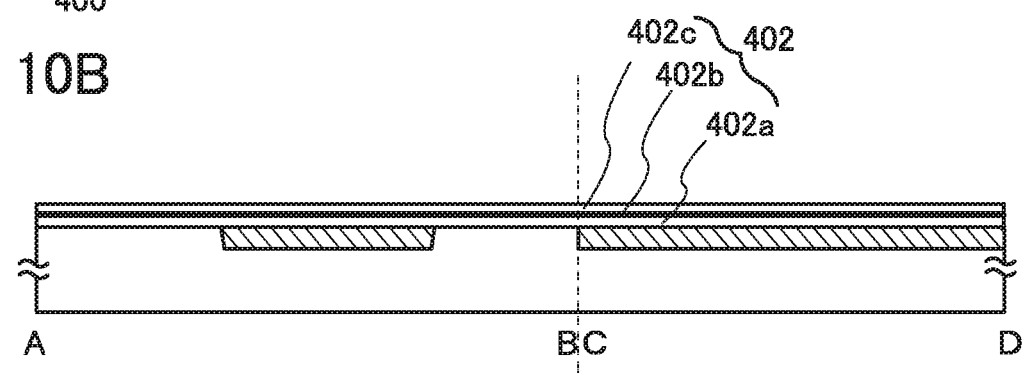

Furthermore, the base insulating layer 402 composed of the first to third insulating layers 402a to 402c is formed (see FIG. 10B).

Oxygen may be added to the base insulating layer 402 by an ion implantation method, an ion doping method, a plasma immersion ion implantation method, or the like. Adding oxygen enables the base insulating layer 402 to supply oxygen much easily to the multilayer semiconductor layer 404.

Figure 10C:
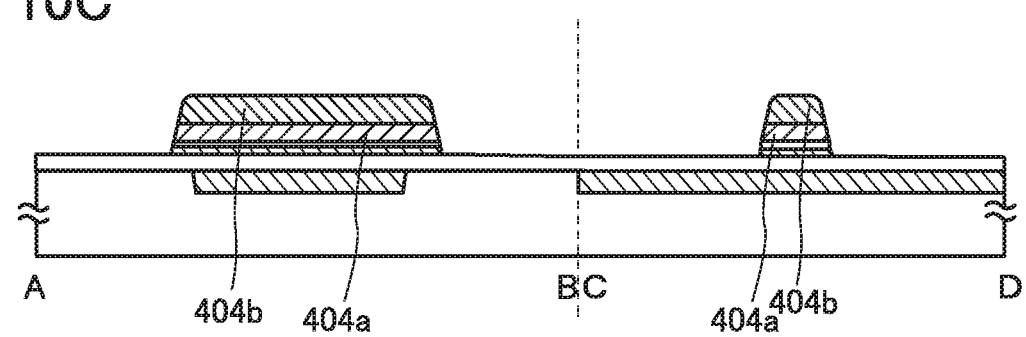

Next, the oxide semiconductor layers 404a and 404b are formed over the base insulating layer 402 by sputtering, CVD (including MOCVD, ALD, or PECVD), vacuum evaporation, or pulse laser deposition (PLD) (see FIG. 10C). At this time, as shown in FIG. 10C, the base insulating layer 402 can be slightly over-etched. By over-etching of the base insulating layer 402, the gate electrode 410 to be formed later can cover the oxide semiconductor layer 404c easily.

For processing the oxide semiconductor layer 404a and the oxide semiconductor layer 404b into island shapes, a layer to be a hard mask (e.g., a tungsten layer) and a resist mask are provided over the oxide semiconductor layer 404b, and the layer to be a hard mask is etched to form a hard mask. The resist mask is removed and then the oxide semiconductor layer 404a and the oxide semiconductor layer 404b are etched using the hard mask as a mask. Then, the resist mask is removed. At this step, the hard mask is gradually reduced as the etching progresses; as a result, the edges of the hard mask is rounded to have a curved surface. Accordingly, the edges of the oxide semiconductor layer 404b is rounded to have a curved surface. This structure improves the coverage with the oxide semiconductor layer 404c, the gate insulating layer 408, the gate electrode 410, and the oxide insulating layer 412, which are to be formed over the oxide semiconductor layer 404b, and can prevent shape defects such as disconnection. In addition, electric field concentration which might occur at end portions of the source electrode 406a and the drain electrode 406b can be reduced, which can reduce deterioration of the transistor.

In order to form continuous junction in a stacked-layer including the oxide semiconductor layers 404a and 404b, or a stacked-layer including the oxide semiconductor layers 404a, 404b, and 404c to be formed in a later step, the layers need to be formed successively without exposure to the air with the use of a multi-chamber deposition apparatus (e.g., a sputtering apparatus) including a load lock chamber. It is preferable that each chamber of the sputtering apparatus be able to be evacuated to a high vacuum (to about $5\times10^{-7}$ Pa to $1\times10^{-4}$ Pa) by an adsorption vacuum pump such as a cryopump and that the chamber be able to heat a substrate to 100° C. or higher, preferably 500° C. or higher so that water and the like acting as impurities of the oxide semiconductor can be removed as much as possible. Alternatively, a combination of a turbo molecular pump and a cold trap is preferably used to prevent back-flow of a gas containing a carbon component, moisture, or the like from an exhaust system into the chamber.

Not only high vacuum evacuation in a chamber but also increasing the purity of a sputtering gas is necessary to obtain a high-purity intrinsic oxide semiconductor. As an oxygen gas or an argon gas used for a sputtering gas, a gas which is highly purified to have a dew point of −40° C. or lower, preferably −80° C. or lower, further preferably −100° C. or lower is used, whereby entry of moisture or the like into the oxide semiconductor layer can be prevented as much as possible.

The materials described in Embodiment 2 can be used for the oxide semiconductor layer 404a, the oxide semiconductor layer 404b, and the oxide semiconductor layer 404c that is to be formed in a later step. For example, an In—Ga—Zn oxide whose atomic ratio of In to Ga and Zn is 1:3:4 or 1:3:2 can be used for the oxide semiconductor layer 404a, an In—Ga—Zn oxide whose atomic ratio of In to Ga and Zn is 1:1:1 can be used for the oxide semiconductor layer 404b, and an In—Ga—Zn oxide whose atomic ratio of In to Ga and Zn is 1:3:4 or 1:3:2 can be used for the oxide semiconductor layer 404c.

An oxide semiconductor that can be used for each of the oxide semiconductor layers 404a, 404b, and 404c preferably contains at least indium (In) or zinc (Zn). Both In and Zn are preferably contained. Furthermore, in order to reduce variations in electrical characteristics of the transistors including the oxide semiconductor, the oxide semiconductor preferably contains a stabilizer in addition to In and Zn.

As a stabilizer, gallium (Ga), tin (Sn), hafnium (Hf), aluminum (Al), zirconium (Zr), and the like are used. As another stabilizer, lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) can be given.

As the oxide semiconductor, for example, any of the following can be used: indium oxide, tin oxide, zinc oxide, In—Zn oxide, Sn—Zn oxide. Al—Zn oxide, Zn—Mg oxide, Sn—Mg oxide, In—Mg oxide, In—Ga oxide, In—Ga—Zn oxide, In—Al—Zn oxide, In—Sn—Zn oxide, Sn—Ga—Zn oxide. Al—Ga—Zn oxide, Sn—Al—Zn oxide. In—Hf—Zn oxide, In—La—Zn oxide, In—Ce—Zn oxide, In—Pr—Zn oxide, In—Nd—Zn oxide, In—Sm—Zn oxide, In—Eu—Zn oxide, In—Gd—Zn oxide, In—Tb—Zn oxide, In—Dy—Zn oxide, In—Ho—Zn oxide, In—Er—Zn oxide, In—Tm—Zn oxide, In—Yb—Zn oxide, In—Lu—Zn oxide, In—Sn—Ga—Zn oxide, In—Hf—Ga—Zn oxide, In—Al—Ga—Zn oxide, In—Sn—Al—Zn oxide, In—Sn—Hf—Zn oxide, or In—Hf—Al—Zn oxide.

For example, "In—Ga—Zn oxide" means an oxide containing In, Ga, and Zn as its main components. The In—Ga—Zn oxide may contain another metal element in addition to In, Ga. and Zn. Note that in this specification, a layer containing the In—Ga—Zn oxide is also referred to as an IGZO layer.

Alternatively, a material represented by $InMO_3(ZnO)_m$ (m>0 is satisfied, and m is not an integer) may be used. Note that M represents one or more metal elements selected from Ga, Fe, Mn, or Co. A material represented by $In_2SnO_5(ZnO)_n$ (n>0, n is an integer) may be used.

Note that as described in Embodiment 2 in detail, materials are selected so that the oxide semiconductor layers 404a and 404c each have an electron affinity lower than that of the oxide semiconductor layer 404b.

Note that the oxide semiconductor layer is preferably formed by a sputtering method. As a sputtering method, an RF sputtering method, a DC sputtering method, an AC sputtering method, or the like can be used. In particular, a DC sputtering method is preferably used because dust generated in the film formation can be reduced and the film thickness can be uniform.

When In—Ga—Zn oxide is used for the oxide semiconductor layers 404a, 404b, and 404c, a material whose atomic ratio of In to Ga and Zn is any of 1:1:1, 2:2:1, 3:1:2, 1:3:2, 1:3:4, 1:4:3, 1:5:4, 1:6:6, 2:1:3 1:6:4, 1:9:6, 1:1:4, and 1:1:2 is used so that the oxide semiconductor layers 404a and 404c each have an electron affinity lower than that of the oxide semiconductor layer 404b.

Note that the expression "the composition of an oxide including In, Ga, and Zn at the atomic ratio, In:Ga:Zn=a:b:c (a+b+c=1), is in the neighborhood of the composition of an oxide containing In, Ga, and Zn at the atomic ratio. In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

The indium content in the oxide semiconductor layer 404b is preferably higher than those in the oxide semiconductor layers 404a and 404c. In an oxide semiconductor, the s orbital of heavy metal mainly contributes to carrier transfer, and when the proportion of In in the oxide semiconductor is increased, overlap of the s orbitals is likely to be increased. Therefore, an oxide having a composition in which the proportion of In is higher than that of Ga has higher mobility than an oxide having a composition in which the proportion of In is equal to or lower than that of Ga. Thus, with use of an oxide having a high indium content for the oxide semiconductor layer 404b, a transistor having high mobility can be achieved.

Here, a structure of an oxide semiconductor layer will be described.

In this specification, a term "parallel" indicates that the angle formed between two straight lines is greater than or equal to −10° and less than or equal to 10°, and accordingly also includes the case where the angle is greater than or equal to −5° and less than or equal to 5°. The term "perpendicular" indicates that the angle formed between two straight lines is greater than or equal to 80° and less than or equal to 100°, and accordingly includes the case where the angle is greater than or equal to 85° and less than or equal to 95°.

In this specification, trigonal and rhombohedral crystal systems are included in a hexagonal crystal system.

An oxide semiconductor layer is classified roughly into a non-single-crystal oxide semiconductor layer and a single crystal oxide semiconductor layer. The non-single-crystal oxide semiconductor layer includes any of a c-axis aligned crystalline oxide semiconductor (CAAC-OS) layer, a polycrystalline oxide semiconductor layer, a microcrystalline oxide semiconductor layer, an amorphous oxide semiconductor layer, and the like.

First of all, a CAAC-OS layer is described.

The CAAC-OS layer is an oxide semiconductor layer including a plurality of crystal parts. Most of the crystal parts each fit inside a cube whose one side is less than 100 nm. Thus, the CAAC-OS layer may include a crystal part that fits inside a cube whose one side is less than 10 nm, less than 5 nm, or less than 3 nm.

In a transmission electron microscope (TEM) image of the CAAC-OS layer, a boundary between crystal parts, that is, a grain boundary is not clearly observed. Thus, in the CAAC-OS layer, a reduction in electron mobility due to the grain boundary is less likely to occur.

In the TEM image of the CAAC-OS layer observed in a direction substantially parallel to a sample surface (cross-sectional TEM image), metal atoms are arranged in a layered manner in the crystal parts. Each metal atom layer has a morphology reflected by a surface over which the CAAC-OS layer is formed (hereinafter, a surface over which the CAAC-OS layer is formed is referred to as a formation surface) or a top surface of the CAAC-OS layer, and is arranged in parallel to the formation surface or the top surface of the CAAC-OS layer.

In the TEM image of the CAAC-OS layer observed in a direction substantially perpendicular to the sample surface (planar TEM image), metal atoms are arranged in a triangular or hexagonal configuration in the crystal parts. However, there is no regularity in arrangement of metal atoms between different crystal parts.

From the cross-sectional TEM image and the planar TEM image, orientation characteristics are found in the crystal parts in the CAAC-OS layer.

A CAAC-OS layer is subjected to structural analysis with an X-ray diffraction (XRD) apparatus. For example, when the CAAC-OS layer including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS layer.

When the CAAC-OS layer is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Analysis (φ scan) is performed under conditions where the sample is rotated around a normal vector of the sample surface as an axis (f axis) with 2θ fixed at around 56°. When the sample is a single-crystal oxide semiconductor layer of $InGaZnO_4$, six peaks appear. The six peaks are derived from crystal planes equivalent to the (110) plane. In contrast, when the sample is the CAAC-OS layer, a peak is not clearly observed.

The above results mean that in the CAAC-OS layer having c-axis alignment, the directions of a-axes and b-axes are different between crystal parts, but the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS layer or is formed through crystallization treatment such as heat treatment. As described above, the c-axis of the crystal is oriented in a direction parallel to a normal vector of a formation surface or a normal vector of a top surface. Thus, for example, when the shape of the CAAC-OS layer is changed by etching or the like, the c-axis might not be necessarily parallel to a normal vector of a formation surface or a normal vector of a top surface of the CAAC-OS layer.

Furthermore, the degree of crystallinity in the CAAC-OS layer is not necessarily uniform. For example, if crystal growth leading to the CAAC-OS layer occurs from the vicinity of the top surface of the layer, the degree of the crystallinity in the vicinity of the top surface may be higher than that in the vicinity of the formation surface. Moreover, when an impurity is added to the CAAC-OS layer, the crystallinity in a region to which the impurity is added is changed, and the degree of crystallinity in the CAAC-OS layer varies depending on regions.

Note that when the CAAC-OS layer with an $InGaZnO_4$ crystal is analyzed by an out-of-plane method, a peak of 2θ may be observed at around 36°, in addition to the peak of 2θ at around 31°. The peak of 2θ at around 36° indicates that a crystal having no c-axis alignment is included in part of the CAAC-OS layer. It is preferable that a peak of 2θ appears at around 31° and a peak of 2θ do not appear at around 36°.

The CAAC-OS layer is an oxide semiconductor layer having low impurity concentration. The impurity is an element other than the main components of the oxide semiconductor layer, such as hydrogen, carbon, silicon, or a transition metal element. In particular, an element that has higher bonding strength to oxygen than a metal element included in the oxide semiconductor layer, such as silicon, disturbs the atomic arrangement of the oxide semiconductor layer by depriving the oxide semiconductor layer of oxygen and causes a decrease in crystallinity. A heavy metal such as iron or nickel, argon, carbon dioxide, or the like has a large atomic radius (molecular radius), and thus disturbs the atomic arrangement of the oxide semiconductor layer and causes a decrease in crystallinity if contained in the oxide semiconductor layer. Note that the impurity contained in the oxide semiconductor layer might serve as a carrier trap or a carrier generation source.

The CAAC-OS layer is an oxide semiconductor layer having a low density of defect states. Oxygen vacancies in the oxide semiconductor layer may serve as carrier traps or carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor layer has few carrier generation sources, and thus can have a low carrier density. Thus, a transistor including the oxide semiconductor layer rarely has negative threshold voltage (is rarely normally on). The highly purified intrinsic or substantially highly purified intrinsic oxide semiconductor layer has few carrier traps. Accordingly, the transistor including the oxide semiconductor layer has little variation in electrical characteristics and high reliability. Electric charge trapped by the carrier traps in the oxide semiconductor layer takes a long time to be released, and thus may behave like fixed electric charge. Accordingly, the transistor which includes the oxide semiconductor layer having high impurity concentration and a high density of defect states can have unstable electrical characteristics.

In a transistor using the CAAC-OS layer, change in electrical characteristics due to irradiation with visible light or ultraviolet light is small.

Next, a microcrystalline oxide semiconductor layer will be described.

In a TEM image, crystal parts cannot be found clearly in the microcrystalline oxide semiconductor layer in some cases. In most cases, the crystal part size in the microcrystalline oxide semiconductor is more than or equal to 1 nm and less than or equal to 100 nm, or more than or equal to 1 nm and less than or equal to 10 nm. A microcrystal with a size more than or equal to 1 nm and less than or equal to 10 nm, or a size more than or equal to 1 nm and less than or equal to 3 nm is specifically referred to as nanocrystal (nc). An oxide semiconductor layer including nanocrystal is referred to as an nc-OS (nanocrystalline oxide semiconductor) layer. In a TEM image of the nc-OS layer, for example, a boundary between crystal parts is not clearly detected in some cases.

In the nc-OS layer, a microscopic region (for example, a region with a size more than or equal to 1 nm and less than or equal to 10 nm, in particular, a region with a size more than or equal to 1 nm and less than or equal to 3 nm) has a periodic atomic order. There is no regularity of crystal orientation between different crystal parts in the nc-OS layer. Thus, the orientation of the whole layer is not observed. Accordingly, the nc-OS layer sometimes cannot be distinguished from an amorphous oxide semiconductor layer depending on an analysis method. For example, when the nc-OS layer is subjected to structural analysis by an out-of-plane method with an XRD apparatus using an X-ray having a diameter larger than that of a crystal part, a peak which shows a crystal plane does not appear. Furthermore, a halo pattern is shown in an electron diffraction pattern (also referred to as a selected-area electron diffraction pattern) of the nc-OS layer obtained by using an electron beam having a probe diameter (e.g., more than or equal to 50 nm) larger than the diameter of a crystal part. Meanwhile, spots are shown in a nanobeam electron diffraction pattern of the nc-OS layer obtained by using an electron beam having a probe diameter (e.g., more than or equal to 1 nm and smaller than or equal to 30 nm) close to, or smaller than or equal to a diameter of a crystal part. In a nanobeam electron diffraction pattern of the nc-OS layer, regions with high luminance in a circular (ring) pattern may be shown, and a plurality of spots may be shown in the ring-like region.

The nc-OS layer is an oxide semiconductor layer that has high regularity as compared with an amorphous oxide semiconductor layer. For this reason, the nc-OS layer has a lower density of defect states than an amorphous oxide semiconductor layer. However, there is no regularity of crystal orientation between different crystal parts in the nc-OS layer; hence, the nc-OS layer has a higher density of defect states than the CAAC-OS layer.

Note that an oxide semiconductor layer may be a stacked layer including two or more layers of an amorphous oxide semiconductor layer, a microcrystalline oxide semiconductor layer, and a CAAC-OS layer, for example.

For example, the CAAC-OS layer can be deposited by a sputtering method using a polycrystalline oxide semiconductor sputtering target. When ions collide with the sputtering target, a crystal region included in the sputtering target is sometimes separated from the target along an a-b plane; in other words, a sputtered particle having a plane parallel to an a-b plane (flat-plate-like sputtered particle or pellet-like sputtered particle) flakes off from the sputtering target. The flat-plate-like sputtered particle or pellet-like sputtered particle is electrically charged and thus reaches the substrate while maintaining its crystal state, without being aggregation in plasma, forming a CAAC-OS layer.

First heat treatment may be performed after the oxide semiconductor layer 404b is formed. The first heat treatment may be performed at a temperature higher than or equal to 250° C. and lower than or equal to 650° C., typically higher than or equal to 300° C. and lower than or equal to 500° C., in an inert gas atmosphere, an atmosphere containing an oxidizing gas at 10 ppm or more, or a reduced pressure state. Alternatively, the first heat treatment may be performed in such a manner that heat treatment is performed in an inert gas atmosphere, and then another heat treatment is performed in an atmosphere containing an oxidizing gas at 10 ppm or more, in order to compensate desorbed oxygen. By the first heat treatment, the crystallinity of the oxide semiconductor layer 404b can be improved, and in addition, impurities such as hydrogen and water can be removed from the base insulating layer 402 and the oxide semiconductor layer 404a. Note that the first heat treatment may be performed before etching for formation of the oxide semiconductor layer 404b.

A first conductive layer to be the source electrode 406a and the drain electrode 406b is formed over the oxide semiconductor layers 404a and 404b. For the first conductive layer, Al, Cr, Cu, Ta, Ti, Mo, W, or an alloy material containing any of these as a main component can be used. For example, a 100-nm-thick titanium layer is formed by a sputtering method or the like. Alternatively, a tungsten layer is formed by a CVD method or the like.

Figure 10D:
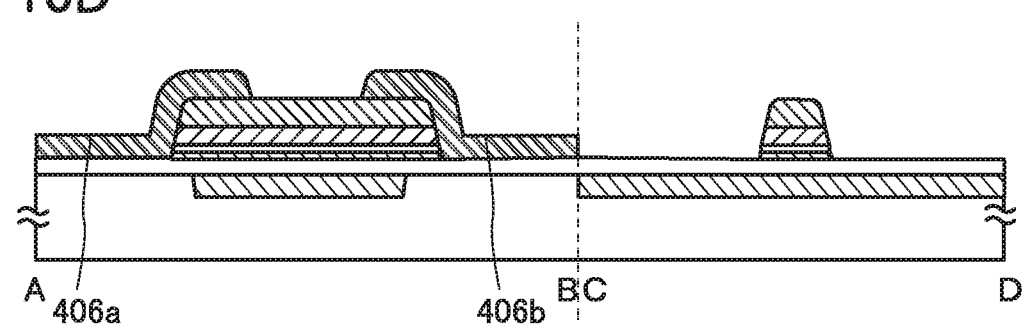

Then, the first conductive layer is etched so as to be divided over the oxide semiconductor layer 404b to form the source electrode 406a and the drain electrode 406b (see FIG. 10D).

Next, the oxide semiconductor layer 403c is formed over the oxide semiconductor layer 404b, the source electrode 406a, and the drain electrode 406b.

Note that second heat treatment may be performed after the oxide semiconductor layer 403c is formed. The second heat treatment can be performed in a condition similar to that of the first heat treatment. The second heat treatment can remove impurities such as hydrogen and water from the oxide semiconductor layer 403c. In addition, impurities such as hydrogen and water can be further removed from the oxide semiconductor layer 404a and 404b.

Figure 11A:
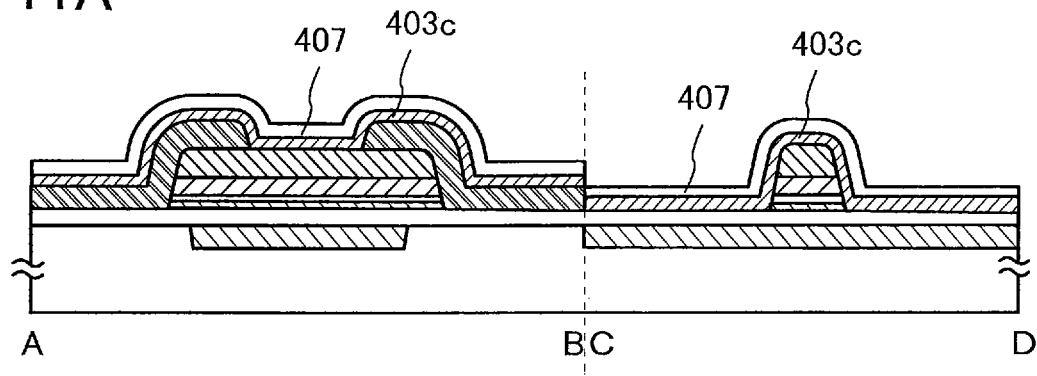
FIGS. 11A to 11C are a top view and cross-sectional views of a transistor.

Next, an insulating layer 407 to be the gate insulating layer 408 is formed over the oxide semiconductor layer 403c (see FIG. 11A). The insulating layer 407 can be formed by sputtering, CVD (including MOCVD, ALD, or PECVD), vacuum evaporation, PLD.

Figure 11B:
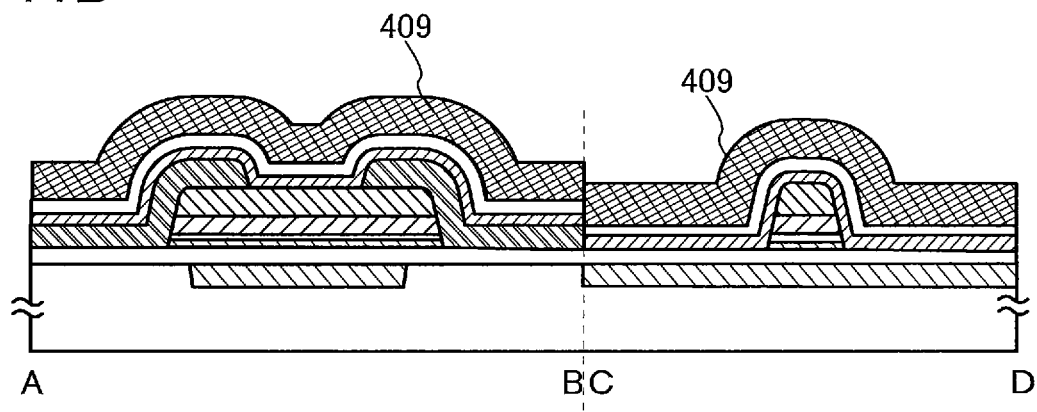

Then, a second conductive layer 409 to be the gate electrode 410 is formed over the insulating layer 407 (see FIG. 11B). For the second conductive layer 409, Al, Ti, Cr, Co, Ni, Cu, Y, Zr, Mo, Ru, Ag, Ta, W, or an alloy material containing any of these as its main component can be used. The second conductive layer 409 can be formed by a sputtering method, a CVD method, or the like. A stack including a conductive layer containing any of the above materials and a conductive layer containing nitrogen, or a conductive layer containing nitrogen may be used for the second conductive layer 409.

Figure 11C:
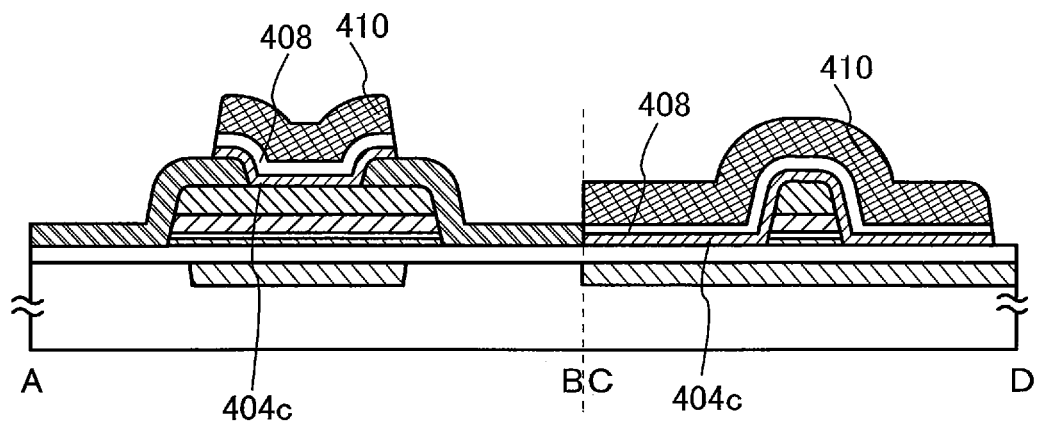

After that, the second conductive layer 409 is selectively etched using a resist mask to form the gate electrode 410 (see FIG. 11C). Note that as shown in FIG. 7C, the oxide semiconductor layer 404b is electrically surrounded by the gate electrode 410.

Then, the insulating layer 407 is selectively etched using the resist mask or the gate electrode 410 as a mask to form the gate insulating layer 408.

Subsequently, the oxide semiconductor layer 403c is etched using the resist mask or the gate electrode 410 as a mask to form the oxide semiconductor layer 404c.

The top edge of the oxide semiconductor 404c is aligned with the bottom edge of the gate insulating layer 408. The top edge of the gate insulating layer 408 is aligned with the bottom edge of the gate electrode 410. Although the gate insulating layer 408 and the oxide semiconductor layer 404c are formed using the gate electrode 410 as a mask, the gate insulating layer 408 and the oxide semiconductor layer 404c may be formed before the second conductive layer 409 is formed.

Next, the oxide insulating layer 412 is formed over the source electrode 406a, the drain electrode 406b, and the gate electrode 410 (see FIGS. 7B and 7C). A material and a method for the oxide insulating layer 412 can be similar to those for the first insulating layer 402a. The oxide insulating layer 412 may be formed using aluminum oxide, magnesium oxide, silicon oxide, silicon oxynitride, silicon nitride oxide, silicon oxynitride, gallium oxide, germanium oxide, yttrium oxide, zirconium oxide, lanthanum oxide, neodymium oxide, hafnium oxide, tantalum oxide, or an oxide insulating layer containing nitrogen. The oxide insulating layer 412 can be formed by sputtering, CVD (including MOCVD, ALD, or PECVD), vacuum evaporation, PLD. The oxide insulating layer 412 preferably contains excessive oxygen so as to be able to supply oxygen to the multilayer semiconductor layer 404.

Next, third heat treatment may be performed. The third heat treatment can be performed under a condition similar to that of the first heat treatment. By the third heat treatment, excess oxygen is easily released from the base insulating layer 402, the gate insulating layer 408, and the oxide insulating layer 412, so that oxygen vacancies in the multilayer semiconductor layer 404 can be reduced.

Next, fourth heat treatment is performed. In the fourth heat treatment, the potential of the gate electrode 401 is kept higher than that of the source or drain electrode at a high temperature higher than or equal to 125° C. and lower than or equal to 450° C., for example higher than or equal to 150° C. and lower than or equal to 300° C. for one second or longer, for example, one minute or longer. As a result, the needed number of electrons moves from the multilayer semiconductor layer 404 toward the gate electrode 401 and some of them are trapped by the electron trap states 106 existing inside the second insulating layer 402b or at the interface with another insulating layer. By controlling the number of trapped electrons, the degree of the threshold increase can be controlled.

Through the above process, the transistor 450 illustrated in FIGS. 7A to 7C can be fabricated.

This embodiment can be combined with any of the other embodiments in this specification as appropriate.

Embodiment 4

Coplanar transistors are described in this embodiment.

Figure 12A:
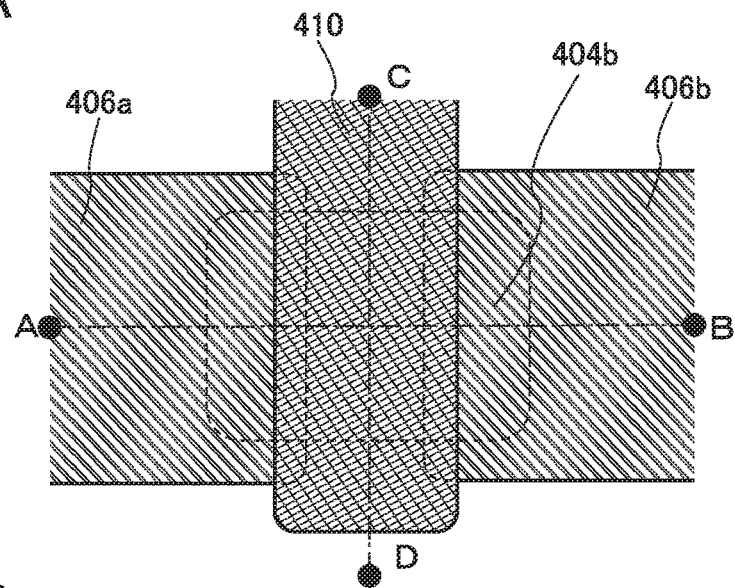
FIGS. 12A to 12C are a top view and cross-sectional views of a transistor.
Figure 12B:
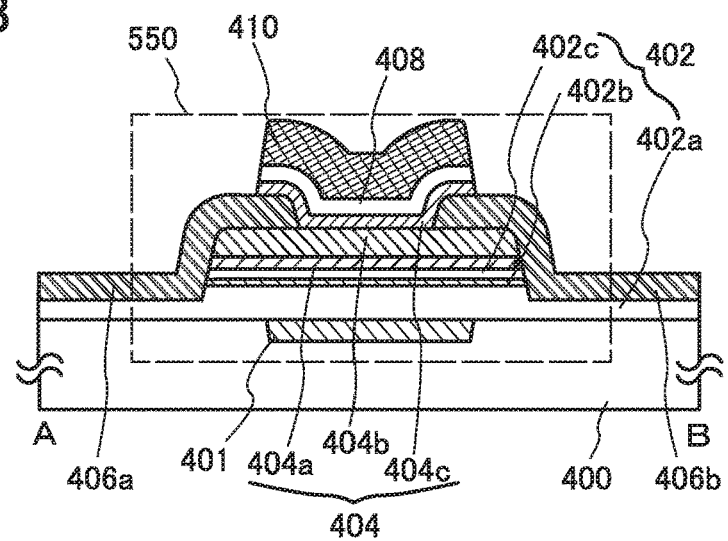
Figure 12C:
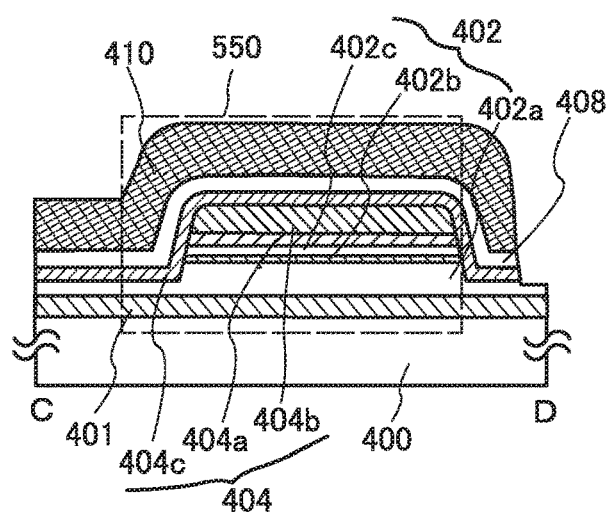

FIGS. 12A to 12C are a top view and cross-sectional views which illustrate a transistor of one embodiment of the present invention. FIG. 12A is the top view. FIG. 12B illustrates a cross section taken along the dashed-dotted line A-B in FIG. 12A. FIG. 12C illustrates a cross section taken along the dashed-dotted line C-D in FIG. 12A. Note that for simplification of the drawing, some components in the top view in FIG. 12A are not illustrated. The direction of the dashed-dotted line A-B is referred to as a channel length direction, and the direction of the dashed-dotted line C-D is referred to as a channel width direction.

A transistor 550 illustrated in FIGS. 12A to 12C includes the base insulating layer 402 over the substrate 400; the oxide semiconductor layer 404a and the oxide semiconductor layer 404b over the base insulating layer 402; the source electrode 406a and the drain electrode 406b over the oxide semiconductor layer 404a and the oxide semiconductor layer 404b; the oxide semiconductor layer 404c in contact with the oxide semiconductor layer 404b, the source electrode 406a, and the drain electrode 406b; the gate insulating layer 408 over the oxide semiconductor layer 404c; the gate electrode 410 over the gate insulating layer 408; and the oxide insulating layer 412 over the source electrode 406a, the drain electrode 406b, and the gate electrode 410. The base insulating layer 402 includes the first insulating layer 402a, the second insulating layer 402b, and the third insulating layer 402c and functions as the electron trap layer described in Embodiment 1. The oxide semiconductor layers 404a. 404b, and 404c are collectively referred to as multilayer semiconductor layer 404.

The transistor 450 in Embodiment 2 is different from the transistor 550 in this embodiment in that each of the channel length and the channel width is more than or equal to twice, typically ten times as large as the thickness of the multilayer semiconductor layer 404.

Note that a channel length refers to a distance between a source (a source region or a source electrode) and a drain (a drain region or a drain electrode) in a region where a semiconductor layer and a gate electrode overlap with each other in a top view. Accordingly, in FIG. 12A, a channel length is a distance between the source electrode 406a and the drain electrode 406b in a region where the oxide semiconductor layer 404b and the gate electrode 410 overlap with each other. A channel width refers to a length of a portion where a source and a drain face each other in parallel and where a semiconductor layer and a gate electrode overlap with each other. Accordingly, in FIG. 12A, a channel width is a length of a portion where the source electrode 406a and the drain electrode 406b face each other and where the oxide semiconductor layer 404b and the gate electrode 410 overlap with each other.

Figure 13A:
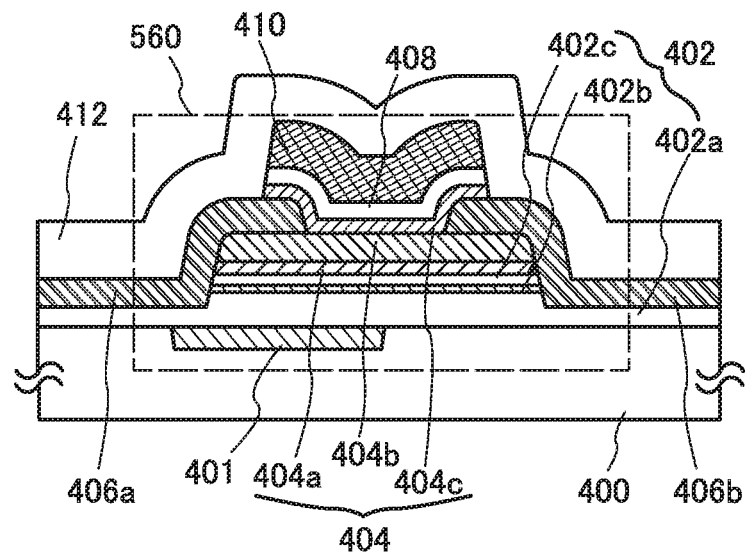
FIGS. 13A and 13B are cross-sectional views of a transistor.

A transistor 560 shown in FIG. 13A may be used. FIG. 13A is a cross-sectional view of the transistor 560. The difference between the transistors 550 and 560 is that the gate electrode 401 of the transistor 560 overlaps the source electrode 406a but does not overlap the drain electrode 406b. Thus, parasitic capacitance generated between the gate electrode 401 and the drain electrode 406b can be reduced. To the contrary, the gate electrode 401 may be placed to overlap the drain electrode 406b but not the source electrode 406a.

Figure 13B:
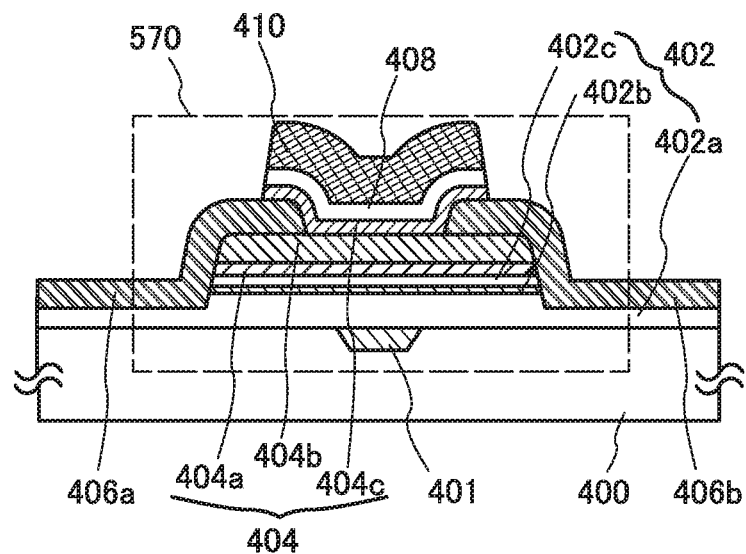

A transistor 570 shown in FIG. 13B may be used. FIG. 13B is a cross-sectional view of the transistor 570. The difference between the transistors 560 and 570 is that the gate electrode 401 of the transistor 570 overlaps neither the source electrode 406a nor the drain electrode 406b. Thus, parasitic capacitance generated between the gate electrode 401 and the source and drain electrodes 406a and 406b can be reduced. Because Icut can be reduced as long as the threshold is high in at least part of a channel, such a structure can be used.

Although this embodiment has a structure in which the oxide semiconductor layer 404b is sandwiched between the oxide semiconductor layers 404a and 404c, without limitation to this structure, a structure including only the oxide semiconductor layer 404b and not including the oxide semiconductor layers 404a and 404c is possible. Alternatively, a structure including any one or two of the oxide semiconductor layers 404a, 404b, and 404c is possible.

This embodiment can be combined with any of the other embodiments in this specification as appropriate.

Embodiment 5

In this embodiment, an example of a circuit including the transistor of one embodiment of the present invention will be described with reference to the drawings.

Figure 14A:
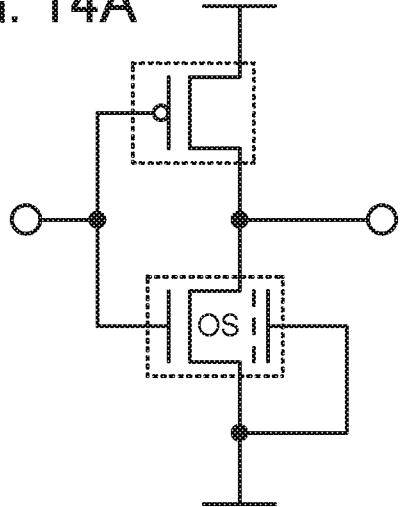
FIGS. 14A to 14D illustrate circuits that use a semiconductor device of one embodiment of the present invention.
Figure 14B:
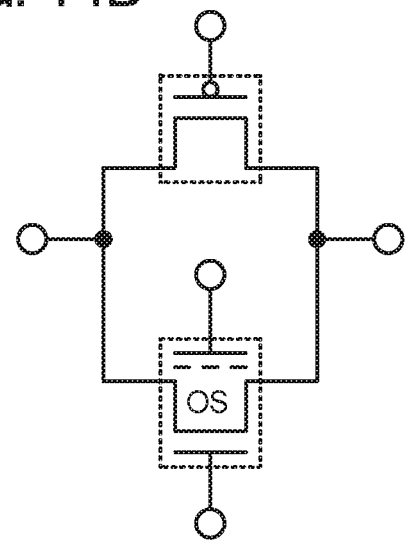
Figure 14C:
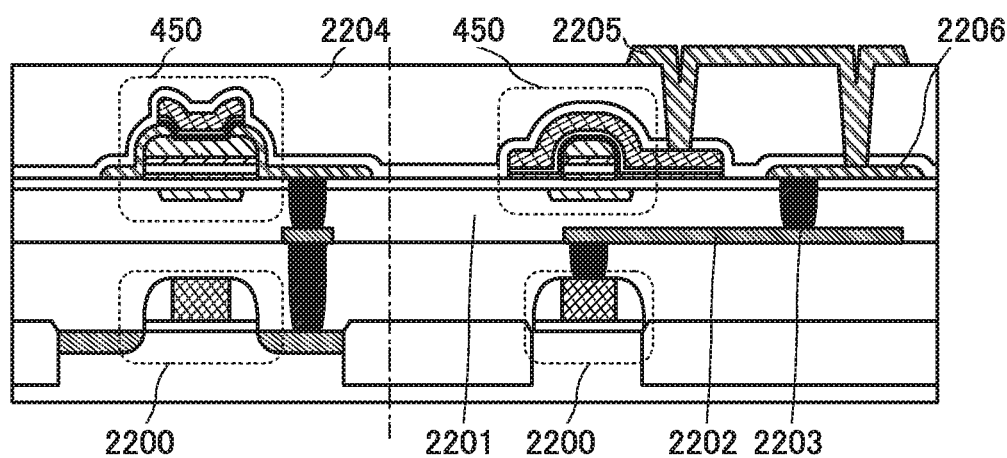
Figure 14D:
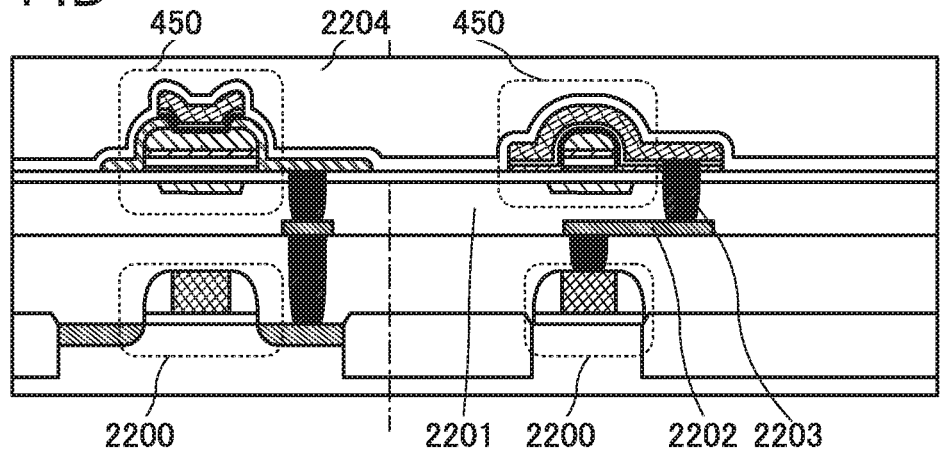

FIGS. 14A and 14B are circuit diagrams of a semiconductor device and FIGS. 14C and 14D are cross-sectional views of a semiconductor device. FIGS. 14C and 14D each illustrate a cross-sectional view of the transistor 450 in a channel length direction on the left and a cross-sectional view of the transistor 450 in a channel width direction on the right. In the circuit diagram, "OS" is written beside a transistor in order to clearly demonstrate that the transistor includes an oxide semiconductor.

The semiconductor devices illustrated in FIGS. 14C and 14D each include a transistor 2200 containing a first semiconductor material in a lower portion and a transistor containing a second semiconductor material in an upper portion. Here, an example is described in which the transistor 450 described in Embodiment 2 as an example is used as the transistor containing the second semiconductor material.

Here, the first semiconductor material and the second semiconductor material are preferably materials having different band gaps. For example, the first semiconductor material may be a semiconductor material (e.g., silicon, germanium, silicon germanium, silicon carbide, or gallium arsenic) other than an oxide semiconductor, and the second semiconductor material may be the oxide semiconductor described in Embodiment 2. A transistor using a material other than an oxide semiconductor, such as single crystal silicon, can operate at high speed easily. In contrast, a transistor including an oxide semiconductor has the low off-state current.

Although the transistor 2200 is a p-channel transistor here, it is needless to say that an n-channel transistor can be used to form a circuit having a different configuration. The specific structure of the semiconductor device, such as the material used for the semiconductor device and the structure of the semiconductor device, is not necessarily limited to those described here except for the use of the transistor described in Embodiment 2, which is formed using an oxide semiconductor.

FIGS. 14A, 14C, and 14D each illustrate a configuration example of what is called a CMOS circuit, in which a p-channel transistor and an n-channel transistor are connected in series and gates of the transistors are connected.

The circuit can operate at high speed because the transistor of one embodiment of the present invention including an oxide semiconductor has high on-state current.

In the structure illustrated in FIG. 14C, the transistor 450 is provided over the transistor 2200 with an insulating layer 2201 positioned therebetween. Wirings 2202 are provided between the transistor 2200 and the transistor 450. Furthermore, wirings and electrodes provided in the upper portion and the lower portion are electrically connected to each other through a plurality of plugs 2203 embedded in insulating layers. Note that an insulating layer 2204 covering the transistor 450, a wiring 2205 over the insulating layer 2204, and a wiring 2206 formed by processing a conductive layer that is also used for a pair of electrodes of the transistor are provided.

When two transistors are stacked as described above, the area occupied by the circuit can be reduced and a plurality of circuits can be arranged with higher density.

In FIG. 14C, one of the source and the drain of the transistor 450 is electrically connected to one of a source and a drain of the transistor 2200 via the wiring 2202 and the plug 2203. The gate of the transistor 450 is electrically connected to a gate of the transistor 2200 via the wiring 2205, the wiring 2206, the plug 2203, the wiring 2202, and the like.

In the configuration illustrated in FIG. 14D, an opening portion in which the plug 2203 is embedded is provided in a gate insulating layer of the transistor 450, and the gate of the transistor 450 is in contact with the plug 2203 in the opening portion. Such a configuration makes it possible to achieve the integration of the circuit easily and to reduce the lengths and the number of wirings and plugs used to be smaller than those in the configuration illustrated in FIG. 14C; thus, the circuit can operate at higher speed.

Note that when a connection between the electrodes of the transistor 450 and the transistor 2200 is changed from that in the configuration illustrated in FIG. 14C or FIG. 14D, a variety of circuits can be formed. For example, a circuit having a configuration in which a source and a drain of a transistor are connected to those of another transistor as illustrated in FIG. 14B can operate as what is called an analog switch.

A semiconductor device having an image sensor function for reading data of an object can be fabricated with the use of the transistor described in any of the above embodiments.

Figure 15:
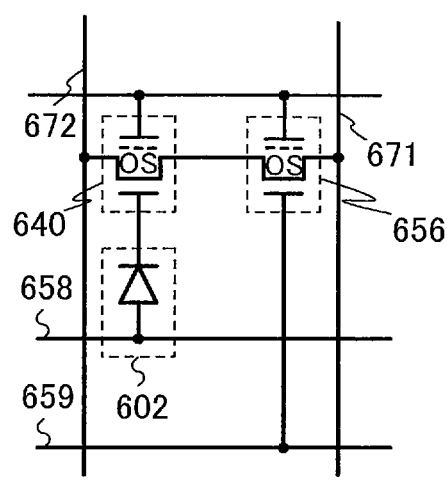
FIG. 15 is a circuit diagram of a semiconductor device of an embodiment.

FIG. 15 illustrates an example of an equivalent circuit of a semiconductor device having an image sensor function.

One electrode of a photodiode 602 is electrically connected to a photodiode reset signal line 658, and the other electrode of the photodiode 602 is electrically connected to one gate of a transistor 640. One of a source and a drain of the transistor 640 is electrically connected to a photo sensor reference signal line 672, and the other of the source and the drain thereof is electrically connected to one of a source and a drain of a transistor 656. One gate of the transistor 656 is electrically connected to a gate signal line 659, and the other of the source and the drain thereof is electrically connected to a photo sensor output signal line 671. The other gate (backgate) of the transistor 640 and the other gate (backgate) of the transistor 656 are connected to a ground line 673.

As the photodiode 602, for example, a pin photodiode in which a semiconductor layer having p-type conductivity, a high-resistance semiconductor layer (semiconductor layer having i-type conductivity), and a semiconductor layer having n-type conductivity are stacked can be used.

With detection of light that enters the photodiode 602, data on an object to be detected can be read. Note that a light source such as a backlight can be used at the time of reading data of an object.

As each of the transistor 640 and the transistor 656, the transistor in which a channel is formed in an oxide semiconductor, which is described in any of the above embodiments, can be used. In FIG. 15, "OS" is written beside the transistor 640 and the transistor 656 so that the transistors 640 and 656 can be identified as transistors including an oxide semiconductor.

It is preferable that each of the transistor 640 and the transistor 656 be one of the transistors described in the above embodiments, in which the oxide semiconductor layer is electrically covered with the gate electrode. When the oxide semiconductor layer has round end portions and a curved surface in the transistor, coverage with a film formed over the oxide semiconductor layer can be improved. In addition, electric field concentration which might occur at end portions of the source electrode and the drain electrode can be reduced, which can suppress deterioration of the transistor. Therefore, variation in the electric characteristics of the transistor 640 and the transistor 656 is suppressed, and the transistor 640 and the transistor 656 are electrically stable. When including the transistor, the semiconductor device having an image sensor function, which is illustrated in FIG. 15, can be highly reliable.

This embodiment can be combined with any of the other embodiments in this specification as appropriate.

Embodiment 6

In this embodiment, a CPU in which at least the transistor described in the above embodiment can be used and the memory device described in the above embodiment is included will be described.

Figure 16:
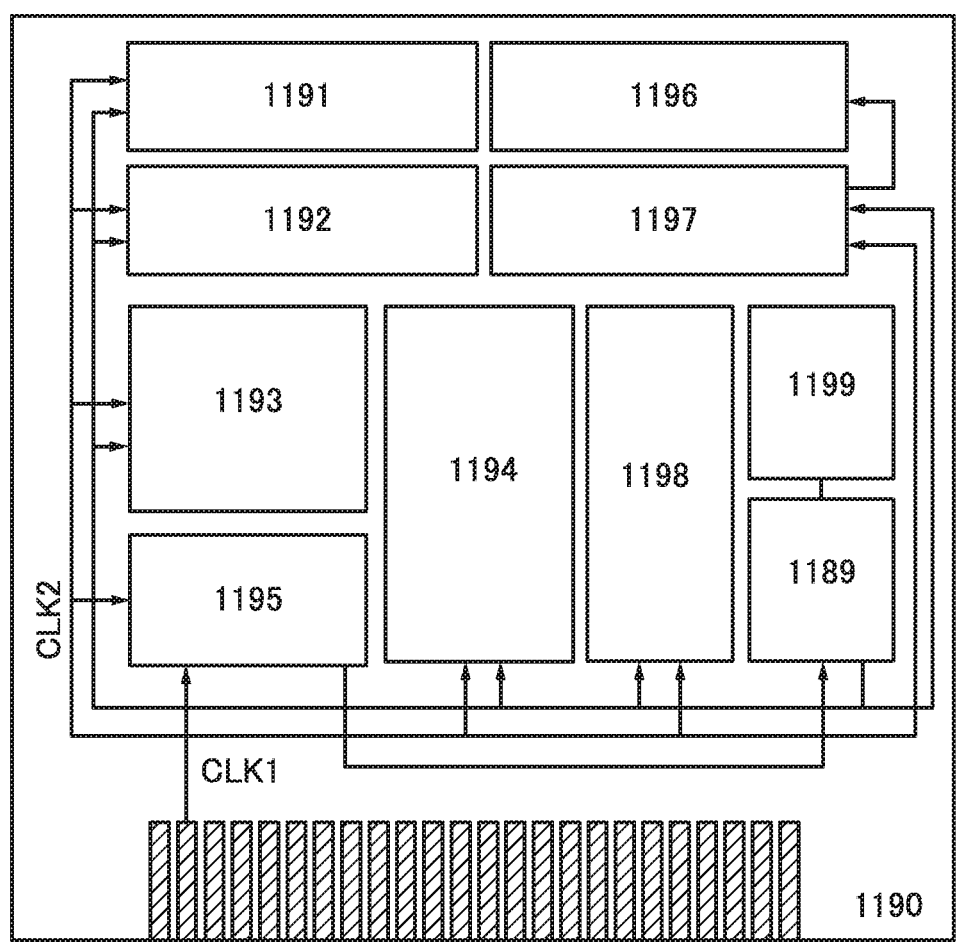
FIG. 16 is a block diagram of a semiconductor device of an embodiment.

FIG. 16 is a block diagram illustrating a configuration example of a CPU at least partly including the transistor shown in Embodiment 2.

The CPU illustrated in FIG. 16 includes an arithmetic logic unit (ALU) 1191, an ALU controller 1192, an instruction decoder 1193, an interrupt controller 1194, a timing controller 1195, a register 1196, a register controller 1197, a bus interface 1198 (BUS I/F), a rewritable ROM 1199, and an ROM interface (ROM IF) 1189 over a substrate 1190. A semiconductor substrate, an SOI substrate, a glass substrate, or the like is used as the substrate 1190. The ROM 1199 and the ROM interface 1189 may be provided over a separate chip. Needless to say, the CPU in FIG. 16 is just an example in which the configuration has been simplified, and an actual CPU may have various configurations depending on the application. For example, the CPU may have the following configuration: a structure including the CPU illustrated in FIG. 16 or an arithmetic circuit is considered as one core; a plurality of the cores is included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit depending on its priority or a mask state. The register controller 1197 generates an address of the register 1196, and reads/writes data from/to the register 1196 depending on the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 on the basis of a reference clock signal CLK1, and supplies the internal clock signal CLK2 to the above circuits.

In the CPU illustrated in FIG. 16, a memory cell is provided in the register 1196. For the memory cell of the register 1196 or a cache memory, any of the transistors described in the above embodiments can be used.

In the CPU illustrated in FIG. 16, the register controller 1197 selects operation of holding data in the register 1196 in accordance with an instruction from the ALU 1191. That is, the register controller 1197 selects whether data is held by a flip-flop or by a capacitor in the memory cell included in the register 1196. When data holding by the flip-flop is selected, a power supply voltage is supplied to the memory cell in the register 1196. When data holding by the capacitor is selected, the data is rewritten in the capacitor, and supply of power supply voltage to the memory cell in the register 1196 can be stopped.

Figure 17:
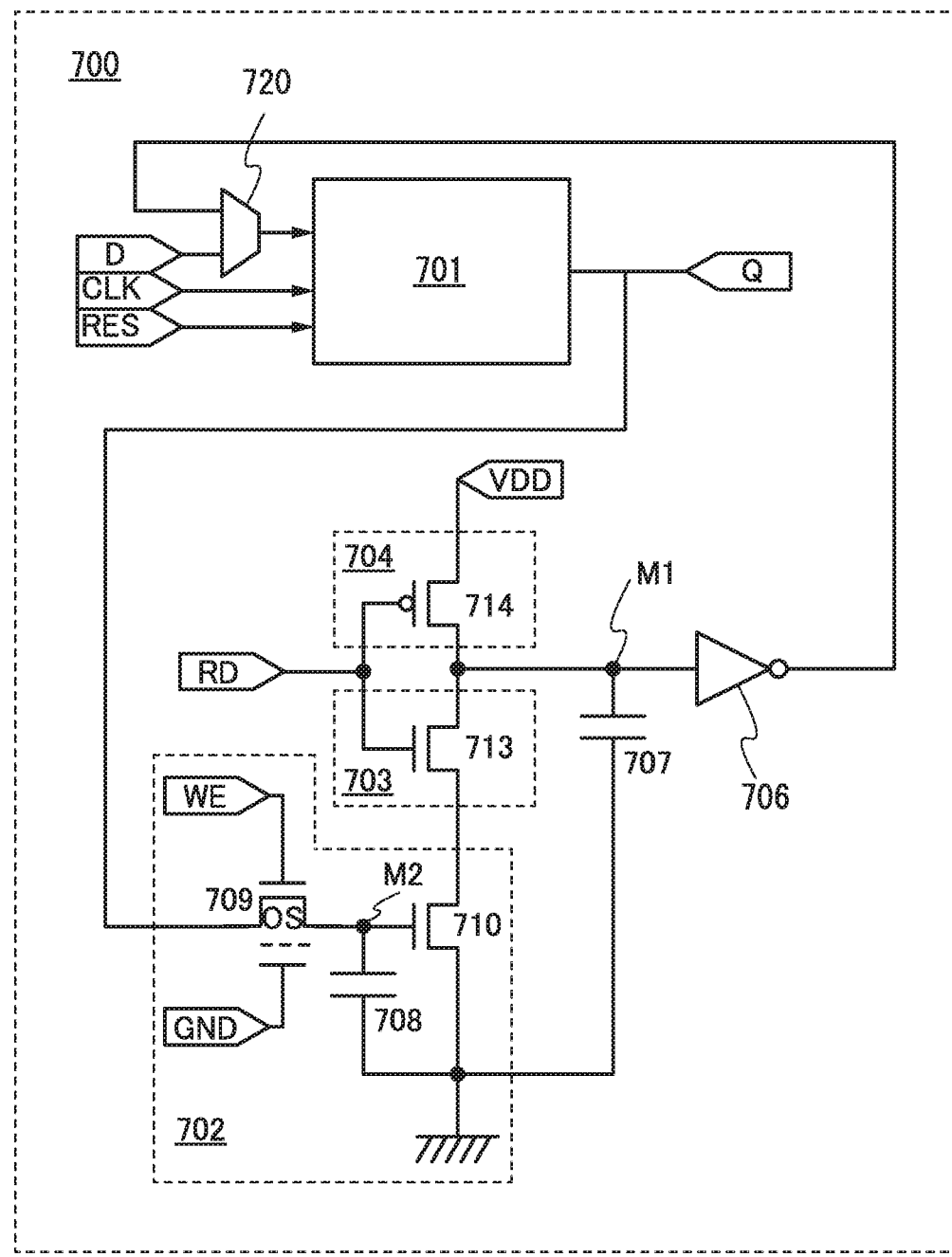
FIG. 17 is a circuit diagram of a memory device of an embodiment.

FIG. 17 is an example of a circuit diagram of a storage element that can be used as the register 1196. A memory element 700 includes a circuit 701 in which stored data is volatile when power supply is stopped, a circuit 702 in which stored data is nonvolatile when power supply is stopped, a switch 703, a switch 704, a logic element 706, a capacitor 707, and a circuit 720 having a selecting function. The circuit 702 includes a capacitor 708, a transistor 709, and a transistor 710. Note that the memory element 700 may further include another element such as a diode, a resistor, or an inductor, as needed.

As the circuit 720, the transistor described in the above embodiments can be used. When supply of the power supply voltage to the memory element 700 is stopped, a ground potential (GND) is input to both gates (a first gate and a second gate) of the transistor 709. For example, the gate of the transistor 709 is grounded through a load such as a resistor. As described in Embodiment 1, the transistor 709 has an extremely low Icut because electrons are trapped in the electron trap layer and thereby the threshold is increased; thus, charge stored in the capacitor 708 can be held for a long period.

An example is shown in which the switch 703 is a transistor 713 having one conductivity type (e.g., an n-channel transistor) and the switch 704 is a transistor 714 having a conductivity type opposite to the one conductivity type (e.g., a p-channel transistor). Here, a first terminal of the switch 703 corresponds to one of a source and a drain of the transistor 713, a second terminal of the switch 703 corresponds to the other of the source and the drain of the transistor 713, and conduction or non-conduction between the first terminal and the second terminal of the switch 703 (i.e., the on/off state of the transistor 713) is selected by a control signal RD input to a gate of the transistor 713. A first terminal of the switch 704 corresponds to one of a source and a drain of the transistor 714, a second terminal of the switch 704 corresponds to the other of the source and the drain of the transistor 714, and conduction or non-conduction between the first terminal and the second terminal of the switch 704 (i.e., the on/off state of the transistor 714) is selected by the control signal RD input to a gate of the transistor 714.

One of a source and a drain of the transistor 709 is electrically connected to one of a pair of electrodes of the capacitor 708 and a gate of the transistor 710. Here, the connection portion is referred to as a node M2. One of a source and a drain of the transistor 710 is electrically connected to a line which can supply a low power supply potential (e.g., a GND line), and the other thereof is electrically connected to the first terminal of the switch 703 (the one of the source and the drain of the transistor 713). The second terminal of the switch 703 (the other of the source and the drain of the transistor 713) is electrically connected to the first terminal of the switch 704 (the one of the source and the drain of the transistor 714). The second terminal of the switch 704 (the other of the source and the drain of the transistor 714) is electrically connected to a line which can supply a power supply potential VDD is supplied. The second terminal of the switch 703 (the other of the source and the drain of the transistor 713), the first terminal of the switch 704 (the one of the source and the drain of the transistor 714), an input terminal of the logic element 706, and one of a pair of electrodes of the capacitor 707 are electrically connected to each other. Here, the connection portion is referred to as a node M1. The other of the pair of electrodes of the capacitor 707 can be supplied with a constant potential. For example, the other of the pair of electrodes of the capacitor 707 can be supplied with a low power supply potential (e.g., GND) or a high power supply potential (e.g., VDD). The other of the pair of electrodes of the capacitor 707 is electrically connected to the line which can supply a low power supply potential (e.g., a GND line). The other of the pair of electrodes of the capacitor 708 can be supplied with a constant potential. For example, the other of the pair of electrodes of the capacitor 707 can be supplied with a low power supply potential (e.g., GND) or a high power supply potential (e.g., VDD). The other of the pair of electrodes of the capacitor 708 is electrically connected to the line which can supply a low power supply potential (e.g., a GND line).

The capacitor 707 and the capacitor 708 are not necessarily provided as long as the parasitic capacitance of the transistor, the wiring, or the like is actively utilized.

A control signal WE is input to the first gate (first gate electrode) of the transistor 709. Note that the potential of the second gate (second gate electrode) of the transistor 709 is kept at GND. As for each of the switch 703 and the switch 704, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data held in the circuit 701 is input to the other of the source and the drain of the transistor 709. FIG. 17 illustrates an example in which a signal output from the circuit 701 is input to the other of the source and the drain of the transistor 709. The logic value of a signal output from the second terminal of the switch 703 (the other of the source and the drain of the transistor 713) is inverted by the logic element 706, and the inverted signal is input to the circuit 701 through the circuit 720.

In the example of FIG. 17, a signal output from the second terminal of the switch 703 (the other of the source and the drain of the transistor 713) is input to the circuit 701 through the logic element 706 and the circuit 720; however, this embodiment is not limited thereto. The signal output from the second terminal of the switch 703 (the other of the source and the drain of the transistor 713) may be input to the circuit 701 without its logic value being inverted. For example, in the case where a node in which a signal obtained by inversion of the logic value of a signal input from the input terminal is held is provided in the circuit 701, the signal output from the second terminal of the switch 703 (the other of the source and the drain of the transistor 713) can be input to the node.

As the transistor 709 in FIG. 17, the transistor described in Embodiment 2 can be used. The control signal WE and the lowest potential in the circuit (e.g., GND) may be input to the first gate and the second gate, respectively.

Further, in FIG. 17, the transistors included in the memory element 700 except for the transistor 709 can each be a transistor in which a channel is formed in a layer formed using a semiconductor other than an oxide semiconductor or in the substrate 1190. For example, the transistor can be a transistor in which a channel is formed in a silicon layer or a silicon substrate. Alternatively, a transistor in which a channel is formed in an oxide semiconductor layer can be used for all the transistors used for the memory element 700. Further alternatively, in the memory element 700, a transistor in which a channel is formed in an oxide semiconductor layer can be included besides the transistor 709, and a transistor in which a channel is formed in a layer or the substrate 1190 including a semiconductor other than an oxide semiconductor can be used for the rest of the transistors.

As the circuit 701 in FIG. 17, for example, a flip-flop circuit can be used. As the logic element 706, for example, an inverter, a clocked inverter, or the like can be used.

In the semiconductor device of one embodiment of the present invention, in a period during which the memory element 700 is not supplied with the power supply voltage, data stored in the circuit 701 can be held by the capacitor 708 which is provided in the circuit 702.

The off-state current of a transistor in which a channel is formed in an oxide semiconductor layer is extremely low. For example, the off-state current of a transistor whose channel is formed in an oxide semiconductor layer is much lower than that of a transistor whose channel is formed in crystalline silicon. Thus, when the transistor is used as the transistor 709, a signal held in the capacitor 708 is held for a long time also in a period during which the power supply voltage is not supplied to the memory element 700. The memory element 700 can accordingly hold the stored content (data) also in a period during which the supply of the power supply voltage is stopped.

Since the switch 703 and the switch 704 are provided, the memory element performs the above pre-charge operation; thus, the time required for the circuit 701 to hold original data again after the supply of the power supply voltage is restarted can be shortened.

In the circuit 702, a signal held by the capacitor 708 is input to the gate of the transistor 710. Therefore, after supply of the power supply voltage to the memory element 700 is restarted, the signal held by the capacitor 708 can be converted into the one corresponding to the state (the on state or the off state) of the transistor 710 to be read from the circuit 702. Consequently, an original signal can be accurately read even when a potential corresponding to the signal held by the capacitor 708 fluctuates to some degree.

By applying the above-described memory element 700 to a memory device such as a register or a cache memory included in a processor, data in the memory device can be prevented from being lost owing to the stop of the supply of the power supply voltage. Further, shortly after the supply of the power supply voltage is restarted, the memory element can be returned to the same state as that before the power supply is stopped. Therefore, the power supply can be stopped even for a short time in the processor or one or a plurality of logic circuits included in the processor. Accordingly, power consumption can be suppressed.

Although an example in which the storage element 700 is used in a CPU is described in this embodiment, the storage element 700 can also be used in a digital signal processor (DSP), a custom LSI, an LSI such as a programmable logic device (PLD), and a radio frequency identification (RF-ID).

This embodiment can be combined with any of the other embodiments disclosed in this specification as appropriate.

Embodiment 7

The semiconductor device of one embodiment of the present invention can be used for display devices, personal computers, image reproducing devices provided with recording media (typically, devices which reproduce the content of recording media such as digital versatile discs (DVDs) and have displays for displaying the reproduced images), or the like. Other examples of electronic devices that can be equipped with the semiconductor device of one embodiment of the present invention are mobile phones, game machines including portable game consoles, portable data appliances, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. Specific examples of these electronic devices are illustrated in FIGS. 18A to 18F.

Figure 18A:
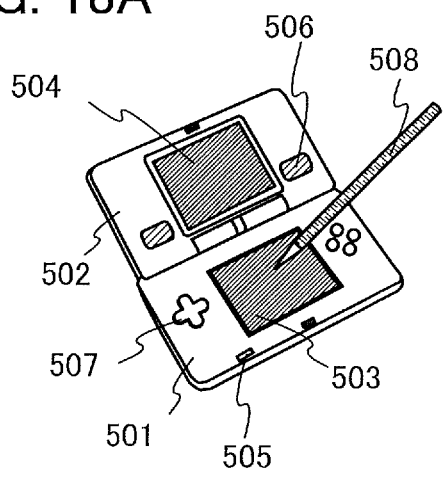
FIGS. 18A to 18F illustrate examples of an electronic device.

FIG. 18A illustrates a portable game machine including a housing 501, a housing 502, a display portion 503, a display portion 504, a microphone 505, a speaker 506, an operation key 507, a stylus 508, and the like. Although the portable game machine in FIG. 18A has the two display portions 503 and 504, the number of display portions included in a portable game machine is not limited to this.

Figure 18B:
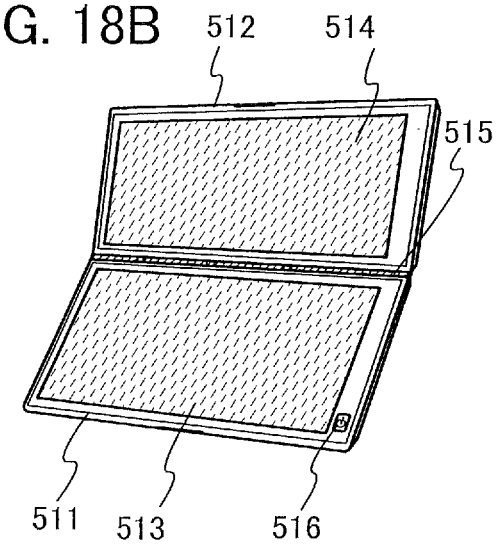

FIG. 18B illustrates a portable data terminal including a first housing 511, a second housing 512, a first display portion 513, a second display portion 514, a joint 515, an operation key 516, and the like. The first display portion 513 is provided in the first housing 511, and the second display portion 514 is provided in the second housing 512. The first housing 511 and the second housing 512 are connected to each other with the joint 515, and the angle between the first housing 511 and the second housing 512 can be changed with the joint 515. An image on the first display portion 513 may be switched depending on the angle between the first housing 511 and the second housing 512 at the joint 515. A display device with a position input function may be used as at least one of the first display portion 513 and the second display portion 514. Note that the position input function can be added by providing a touch panel in a display device. Alternatively, the position input function can be added by provision of a photoelectric conversion element called a photosensor in a pixel area of a display device.

Figure 18C:
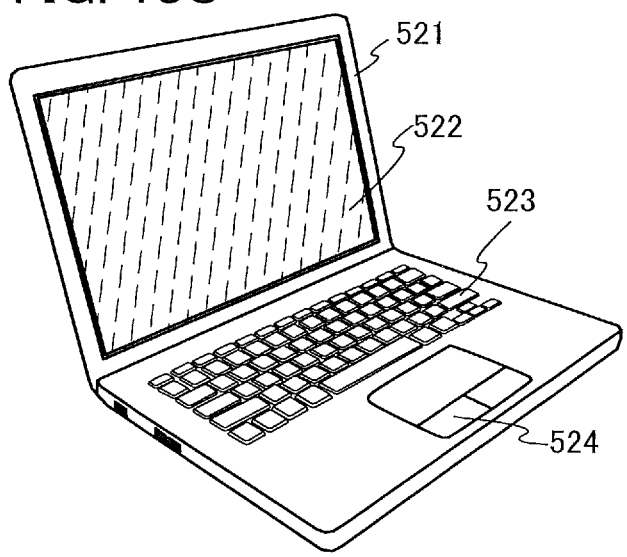

FIG. 18C illustrates a laptop personal computer, which includes a housing 521, a display portion 522, a keyboard 523, a pointing device 524, and the like.

Figure 18D:
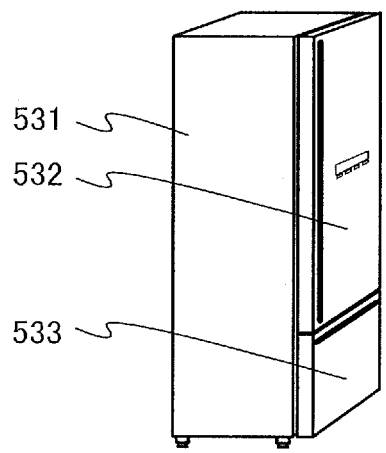

FIG. 18D illustrates the electric refrigerator-freezer including a housing 531, a door for a refrigerator 532, a door for a freezer 533, and the like.

Figure 18E:
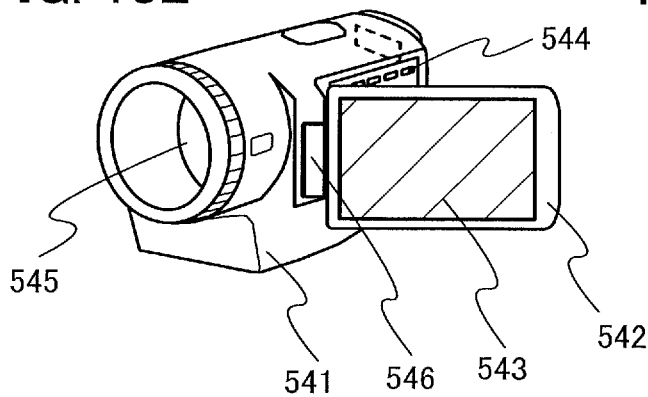

FIG. 18E illustrates a video camera, which includes a first housing 541, a second housing 542, a display portion 543, operation keys 544, a lens 545, a joint 546, and the like. The operation keys 544 and the lens 545 are provided for the first housing 541, and the display portion 543 is provided for the second housing 542. The first housing 541 and the second housing 542 are connected to each other with the joint 546, and the angle between the first housing 541 and the second housing 542 can be changed with the joint 546. Images displayed on the display portion 543 may be switched in accordance with the angle at the joint 546 between the first housing 541 and the second housing 542.

Figure 18F:
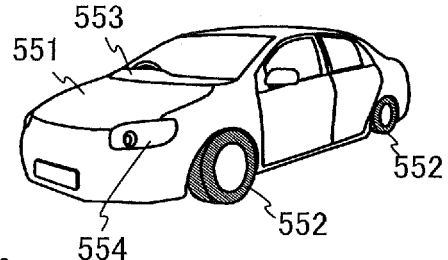

FIG. 18F illustrates a passenger car including a car body 551, wheels 552, a dashboard 553, lights 554, and the like.

This embodiment can be combined with any of the other embodiments disclosed in this specification as appropriate.

Reference Example

In Example, a transistor having as low Icut as 1 yA/μm as described in Embodiment 1 was fabricated, and the off-state current was measured. The results will be described below. The structure of the transistor of reference example is the same as that of the transistor 450 shown in FIGS. 7A to 7C, FIG. 9A to 9C, and FIG. 1 OA to 10D. Note that a gate insulating layer of the transistor of reference example does not function as an electron trap layer.

First, a method for fabricating the reference example sample is described.

First, a silicon oxynitride (SiON) layer to be a base insulating layer was formed to a thickness of 300 nm over a silicon substrate. The silicon oxynitride layer was formed by sputtering under the following conditions: mixed atmosphere of argon and oxygen (argon:oxygen=25 sccm:25 sccm); pressure, 0.4 Pa, power supply (power supply output), 5.0 kW; distance between the silicon substrate and a target, 60 mm; and substrate temperature, 100° C.

A surface of the silicon oxide layer was subjected to polishing treatment, and a 20-nm-thick first oxide semiconductor layer and a 15-nm-thick oxide semiconductor layer were stacked. The first oxide semiconductor layer was formed by sputtering using an oxide target of In:Ga:Zn=1:3:2 (atomic ratio) (IGZO(132)) under the following conditions: mixed atmosphere of argon and oxygen (argon:oxygen=30 sccm:15 sccm); pressure, 0.4 Pa; power supply, 0.5 kW; distance between the substrate and the target, 60 mm; and substrate temperature, 200° C. The second oxide semiconductor layer was formed by sputtering using an oxide target of In:Ga:Zn=1:1:1 (atomic ratio) (IGZO(111)) under the following conditions: mixed atmosphere of argon and oxygen (argon:oxygen=30 sccm:15 sccm); pressure, 0.4 Pa; power supply, 0.5 kW; distance between the substrate and the target, 60 mm; and substrate temperature, 300° C. Note that the first oxide semiconductor layer and the second oxide semiconductor layer were continuously formed without exposure to the air.

Next, heat treatment was performed. The heat treatment was performed under a nitrogen atmosphere at 450° C. for one hour, and then performed under an oxygen atmosphere at 450° C. for one hour.

The first oxide semiconductor layer and the second oxide semiconductor layer were processed into an island shape by inductively coupled plasma (ICP) etching under the following conditions: mixed atmosphere of boron trichloride and chlorine ($BCl_3$:$Cl_2$=60 sccm:20 sccm); power supply, 450 W; bias power, 100 W; and pressure, 1.9 Pa.

Next, a tungsten layer to be a source electrode and a drain electrode was formed to a thickness of 100 nm over the first oxide semiconductor layer and the second oxide semiconductor layer. The layer was formed by sputtering using a tungsten target under the following conditions: argon (80 sccm) atmosphere; pressure, 0.8 Pa; power supply (power supply output), 1.0 kW; distance between the silicon substrate and the target, 60 mm; and substrate temperature, 230° C.

Then, a resist mask was formed over the tungsten layer and first etching was performed thereon. As the etching, first etching, second etching, and third etching were performed. The conditions of the first etching were as follows: mixed atmosphere of carbon tetrafluoride, chlorine, and oxygen ($CF_4$:$Cl_2$:$O_2$=45 sccm:45 sccm:55 sccm); power supply, 3000 W; bias power, 110 W; and pressure, 0.67 Pa. The second etching was performed after the first etching under the following conditions: oxygen atmosphere ($O_2$=100 sccm); power supply, 2000 W; bias power, 0 W; and pressure, 3.0 Pa. The third etching was performed after the second etching under the following conditions: mixed atmosphere of carbon tetrafluoride, chlorine, and oxygen ($CF_4$:$Cl_2$:$O_2$=45 sccm:45 sccm:55 sccm); power supply, 3000 W; bias power, 110 W; and pressure, 0.67 Pa. Thus, the source electrode and the drain electrode were formed.

Next, a third oxide semiconductor layer was formed to a thickness of 5 nm over the second oxide semiconductor layer, the source electrode, and the drain electrode. The film was formed by sputtering using an oxide target of In:Ga:Zn=1:3:2 (atomic ratio) under the following conditions: mixed atmosphere of argon and oxygen (argon:oxygen=30 sccm:15 sccm); pressure, 0.4 Pa; power supply, 0.5 kW; distance between the substrate and the target, 60 mm; and substrate temperature, 200° C.

After formation of the third oxide semiconductor layer, a 10-nm-thick silicon oxynitride layer serving as a gate insulating layer was formed by a CVD method under the following conditions: mixed atmosphere of silane and dinitrogen monoxide ($SiH_4$:$N_2O$=1 sccm:800 sccm); pressure, 200 Pa, power supply, 150 kW; distance between the target and the substrate, 28 mm; and substrate temperature, 350° C.

Then, a 10-nm-thick titanium nitride layer and a 10-nm-thick tungsten layer were formed by a sputtering method. The deposition conditions of the titanium nitride layer by a sputtering method were as follows: a nitrogen (nitrogen=50 sccm) atmosphere; pressure, 0.2 Pa; power supply, 12 kW; distance between the target and the substrate, 400 mm; and substrate temperature, 25° C. The deposition conditions of the tungsten layer by a sputtering method were as follows: an argon (Ar=100 sccm) atmosphere; pressure, 2.0 Pa; power supply, 1 kW; distance between the target and the substrate, 60 mm; and substrate temperature, 230° C.

Next, the stack of the 10-nm-thick titanium nitride layer and the 10-nm-thick tungsten layer was etched by an ICP etching method. As the etching, first etching and second etching were performed. The conditions of the first etching were as follows: mixed atmosphere of chlorine, carbon tetrafluoride, and oxygen ($Cl_2$:$CF_4$:$O_2$=45 sccm:55 sccm:55 sccm); power supply, 3000 W; bias power, 110 W; and pressure, 0.67 Pa. The second etching was performed after the first etching under the following conditions: mixed atmosphere of chlorine and boron trichloride ($Cl_2$:$BCl_3$=50 sccm:150 sccm); power supply, 1000 W; bias power, 50 W; and pressure, 0.67 Pa. Thus, a gate electrode was formed.

Next, a 20-nm-thick aluminum oxide layer was formed over the gate electrode by a sputtering method, and a 150-nm-thick silicon oxynitride film was formed thereover by a CVD method.

Through the process, the reference example transistor was formed. The channel length of the transistor was 50 nm and the channel width thereof was 40 nm.

Next, the off-state current of the fabricated transistor was calculated. Because a current smaller than 1 fA cannot be measured directly, 250,000 transistors of reference example were connected in parallel to manufacture a transistor whose channel width was substantially 10 mm (40 nm×250.000), and the Icut density was calculated.

Figure 19:
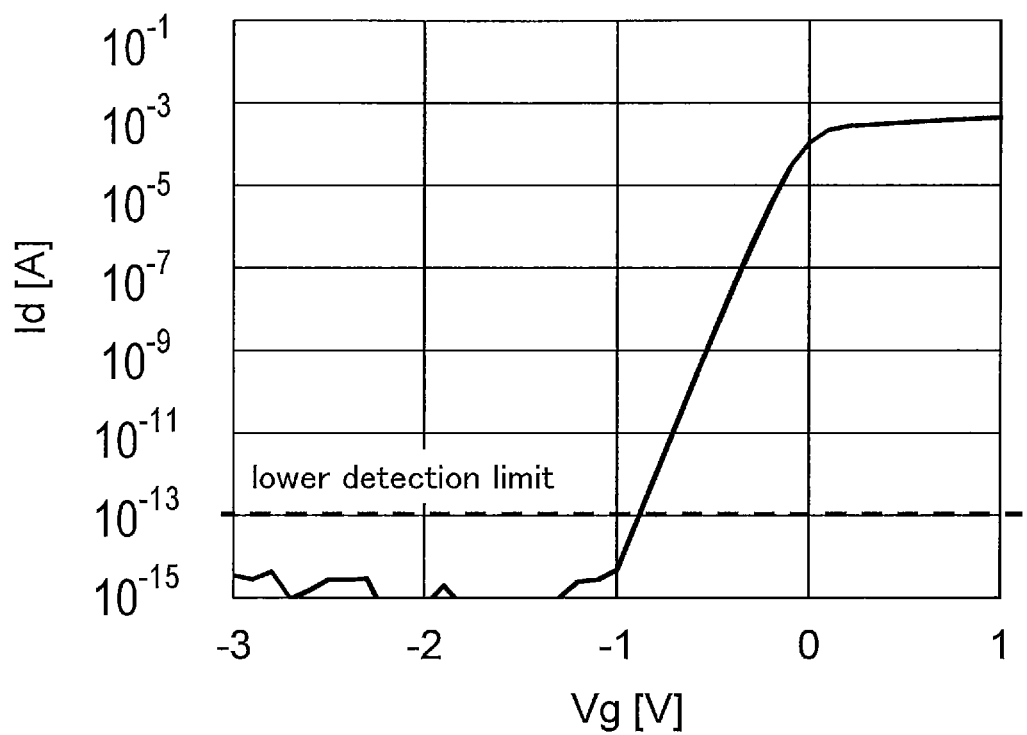
FIG. 19 show measurement results of electrical characteristics of transistors manufactured in Reference Example.

FIG. 19 shows Id-Vg characteristics when the drain potential and the source potential of the transistor whose channel width is 10 mm are 1 V and 0 V, respectively. As shown in FIG. 19, the off-state current of $10^{-13}$ A or lower (i.e., the off-state current density of $10^{-17}$ A/μm or lower) was obtained.

This application is based on Japanese Patent Application serial no. 2013-142308 filed with Japan Patent Office on Jul. 8, 2013, the entire contents of which are hereby incorporated by reference.

What is claimed is:

1. A semiconductor device comprising:
   a first gate electrode;
   an electron trap layer comprising a projection over the first gate electrode;
   a first oxide semiconductor over the projection;
   a second oxide semiconductor over and in direct contact with the first oxide semiconductor;
   a source electrode and a drain electrode in direct contact with a top surface of the second oxide semiconductor;
   a third oxide semiconductor over and in direct contact with the second oxide semiconductor;
   a gate insulating layer over the third oxide semiconductor;
   a second gate electrode over the gate insulating layer; and
   an oxide insulating layer over the second gate electrode,
   wherein the electron trap layer comprises a first insulating layer which is in direct contact with the source electrode and the drain electrode,
   wherein the projection comprises a second insulating layer,
   wherein the second insulating layer comprises hafnium oxide or aluminum oxide,
   wherein the third oxide semiconductor is in direct contact with a side surface of the projection, a side surface of the first oxide semiconductor, and a side surface of the second oxide semiconductor,
   wherein the second gate electrode faces the top surface of the second oxide semiconductor and the side surface of the second oxide semiconductor with the third oxide semiconductor and the gate insulating layer interposed between the second gate electrode and the second oxide semiconductor, and
   wherein the oxide insulating layer is in direct contact with a side surface of the third oxide semiconductor, a side surface of the gate insulating layer, and a side surface of the second gate electrode.

2. The semiconductor device according to claim 1, wherein the third oxide semiconductor is over and in direct contact with the source electrode and the drain electrode.

3. The semiconductor device according to claim 1, wherein each of the first oxide semiconductor, the second oxide semiconductor, and the third oxide semiconductor comprises indium, gallium, and zinc.

4. The semiconductor device according to claim 1, wherein an electron affinity of the second oxide semiconductor is higher than an electron affinity of the first oxide semiconductor.

5. The semiconductor device according to claim 1, wherein a thickness of the second oxide semiconductor is larger than a thickness of the first oxide semiconductor and a thickness of the third oxide semiconductor.

6. The semiconductor device according to claim 1,
   wherein a band gap of the first insulating layer is larger than a band gap of the second insulating layer.

7. The semiconductor device according to claim 1, wherein each of the source electrode and the drain electrode comprises ruthenium.

8. The semiconductor device according to claim 1, wherein the side surface of the second gate electrode, the side surface of the gate insulating layer, and the side surface of the third oxide semiconductor are coplanar with each other.

9. The semiconductor device according to claim 1, wherein the third oxide semiconductor is in direct contact with the first insulating layer and is extending along the first gate electrode with the first insulating layer interposed between the third oxide semiconductor and the first gate electrode.

10. The semiconductor device according to claim 1, wherein the oxide insulating layer is in direct contact with the first insulating layer.

11. A semiconductor device comprising:
    a first gate electrode;
    a layer comprising a projection over the first gate electrode;
    a first oxide semiconductor over the projection;
    a second oxide semiconductor over and in direct contact with the first oxide semiconductor;
    a source electrode and a drain electrode in direct contact with a top surface of the second oxide semiconductor;
    a third oxide semiconductor over and in direct contact with the second oxide semiconductor;
    a gate insulating layer over the third oxide semiconductor;
    a second gate electrode over the gate insulating layer; and
    an oxide insulating layer over the second gate electrode,
    wherein the layer comprises a first insulating layer which is in direct contact with the source electrode and the drain electrode,
    wherein the projection comprises a second insulating layer and a third insulating layer over the second insulating layer,
    wherein the second insulating layer comprises hafnium oxide,
    wherein the third insulating layer comprises silicon and oxygen,
    wherein the third oxide semiconductor is in direct contact with a side surface of the second insulating layer, a side surface of the third insulating layer, a side surface of the first oxide semiconductor, and a side surface of the second oxide semiconductor,
    wherein the second gate electrode faces the top surface of the second oxide semiconductor and the side surface of the second oxide semiconductor with the third oxide semiconductor and the gate insulating layer interposed between the second gate electrode and the second oxide semiconductor, and wherein the oxide insulating layer is in direct contact with a side surface of the third oxide semiconductor, a side surface of the gate insulating layer, and a side surface of the second gate electrode.

12. The semiconductor device according to claim 11, wherein the third oxide semiconductor is over and in direct contact with the source electrode and the drain electrode.

13. The semiconductor device according to claim 11, wherein each of the first oxide semiconductor, the second oxide semiconductor, and the third oxide semiconductor comprises indium, gallium, and zinc.

14. The semiconductor device according to claim 11, wherein an electron affinity of the second oxide semiconductor is higher than an electron affinity of the first oxide semiconductor.

15. The semiconductor device according to claim 11, wherein a thickness of the second oxide semiconductor is larger than a thickness of the first oxide semiconductor and a thickness of the third oxide semiconductor.

16. The semiconductor device according to claim 11, wherein the first insulating layer comprises silicon and oxygen.

17. The semiconductor device according to claim 11, wherein each of the source electrode and the drain electrode comprises ruthenium.

18. The semiconductor device according to claim 11, wherein the side surface of the second gate electrode, the side surface of the gate insulating layer, and the side surface of the third oxide semiconductor are coplanar with each other.

19. The semiconductor device according to claim 11, wherein the third oxide semiconductor is in direct contact with the first insulating layer and is extending along the first gate electrode with the first insulating layer interposed between the third oxide semiconductor and the first gate electrode.

20. The semiconductor device according to claim 11, wherein the oxide insulating layer is in direct contact with the first insulating layer.

* * * * *